United States Patent
Kanemura et al.

(10) Patent No.: US 12,041,800 B2
(45) Date of Patent: Jul. 16, 2024

(54) IMAGING DEVICE AND ELECTRONIC DEVICE

(71) Applicant: Semiconductor Energy Laboratory Co., Ltd., Kanagawa-ken (JP)

(72) Inventors: Takuro Kanemura, Hokkai-do (JP); Yusuke Negoro, Osaka (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 134 days.

(21) Appl. No.: 17/777,384

(22) PCT Filed: Nov. 11, 2020

(86) PCT No.: PCT/IB2020/060593
§ 371 (c)(1),
(2) Date: May 17, 2022

(87) PCT Pub. No.: WO2021/099889
PCT Pub. Date: May 27, 2021

(65) Prior Publication Data
US 2022/0406849 A1    Dec. 22, 2022

(30) Foreign Application Priority Data

Nov. 22, 2019    (JP) .................................. 2019-210989
Dec. 20, 2019    (JP) .................................. 2019-230309

(51) Int. Cl.
*H10K 39/32*    (2023.01)
(52) U.S. Cl.
CPC .................................... *H10K 39/32* (2023.02)
(58) Field of Classification Search
CPC .................................................... H10K 39/32
See application file for complete search history.

(56) References Cited

U.S. PATENT DOCUMENTS 8,436,308 B2    5/2013    Choe et al.
9,294,691 B2    3/2016    Ooki
(Continued)

FOREIGN PATENT DOCUMENTS

CN    101577287 A    11/2009
CN    104541372 A    4/2015
(Continued)

OTHER PUBLICATIONS

International Search Report (Application No. PCT/IB2020/060593) Dated Feb. 9, 2021.
(Continued)

*Primary Examiner* — Robert G Bachner
*Assistant Examiner* — Molly K Reida
(74) *Attorney, Agent, or Firm* — Husch Blackwell LLP

(57) ABSTRACT

An imaging device having a color imaging function and an infrared imaging function is provided. The imaging device has a structure in which a first photoelectric conversion device and a second photoelectric conversion device are stacked, and the second photoelectric conversion device generates electric charge by absorbing infrared light and transmits light having a wavelength of a higher energy than that of infrared light. The first photoelectric conversion device is positioned to overlap with the second photoelectric conversion device, and generates electric charge by absorbing light (visible light) passing through the second photoelectric conversion device. Thus, a subpixel for color imaging and a subpixel for infrared imaging can be positioned to overlap with each other, and an infrared imaging function can be added without a decrease in the definition of color imaging.

7 Claims, 20 Drawing Sheets

(56) References Cited

U.S. PATENT DOCUMENTS

| | | | |
|---|---|---|---|
| 9,577,012 | B2 | 2/2017 | Ooki et al. |
| 10,128,285 | B2 | 11/2018 | Ooki et al. |
| 10,784,293 | B2 | 9/2020 | Ooki et al. |
| 2009/0278048 | A1 | 11/2009 | Choe et al. |
| 2015/0171146 | A1 | 6/2015 | Ooki et al. |
| 2015/0279884 | A1 | 10/2015 | Kusumoto |
| 2018/0301509 | A1* | 10/2018 | Ishii .................. H10K 39/32 |
| 2020/0235168 | A1* | 7/2020 | Lee .................... H10K 59/38 |
| 2022/0057873 | A1 | 2/2022 | Kubota et al. |
| 2022/0069025 | A1 | 3/2022 | Yamazaki et al. |
| 2022/0102419 | A1 | 3/2022 | Yamazaki et al. |

FOREIGN PATENT DOCUMENTS

| | | |
|---|---|---|
| EP | 2 117 047 A1 | 11/2009 |
| EP | 2 879 181 A1 | 6/2015 |
| JP | 2009-272620 A | 11/2009 |
| JP | 2011-119711 A | 6/2011 |
| JP | 2013-068606 A | 4/2013 |
| JP | 2013-070030 A | 4/2013 |
| JP | 2015-103157 A | 6/2015 |
| KR | 2009-0117437 A | 11/2009 |
| KR | 2015-0037810 A | 4/2015 |
| WO | WO 2014/017314 A1 | 1/2014 |

OTHER PUBLICATIONS

Written Opinion (Application No. PCT/IB2020/060593) Dated Feb. 9, 2021.

Mabuchi, K. et al., "CMOS Image Sensor Using a Floating Diffusion Driving Buried Photodiode," ISSCC 2004 (Digest of Technical Papers. IEEE International Solid-State Circuits Conference), Feb. 15, 2004, pp. 112-121.

Mori, M. et al., "A 1/4in 2M Pixel CMOS Image Sensor with 1.75Transistor/Pixe," ISSCC 2004 (Digest of Technical Papers. IEEE International Solid-State Circuits Conference), Feb. 16, 2004, pp. 110-117.

* cited by examiner

FIG. 19A1
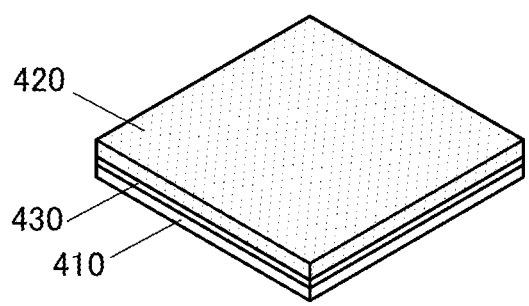
FIG. 19B1
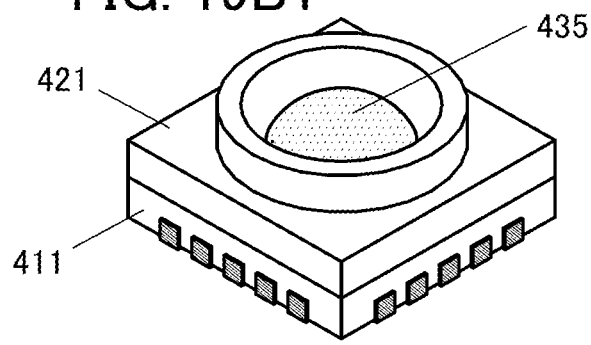
FIG. 19A2
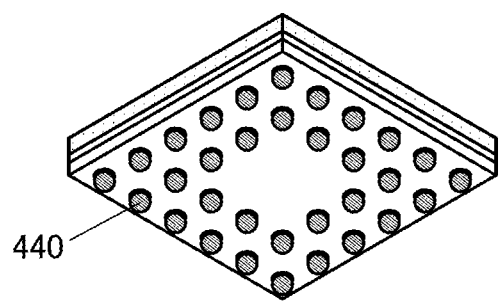
FIG. 19B2
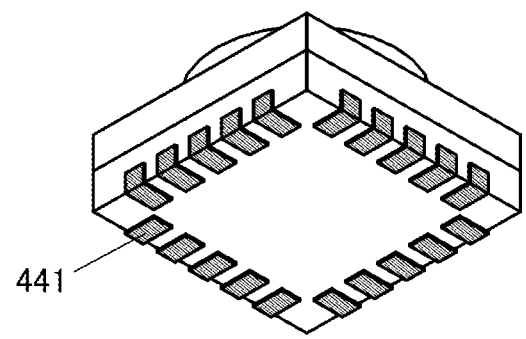
FIG. 19A3
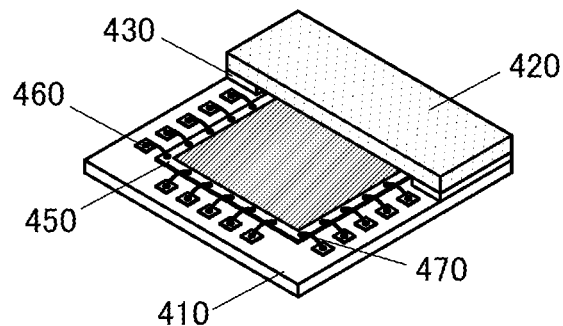
FIG. 19B3
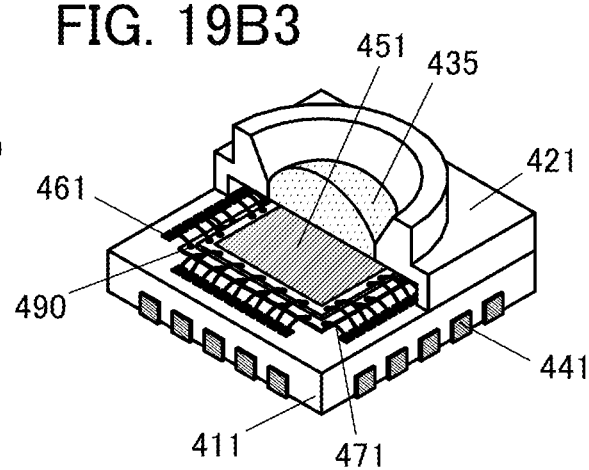

IMAGING DEVICE AND ELECTRONIC DEVICE

This application is a 371 of international application PCT/IB2020/060593 filed on Nov. 11, 2020 which is incorporated herein by reference.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

The imaging device has a structure for obtaining mainly visible-light data, but can also obtain infrared-light data by devising an optical filter and a photodiode. For example, Patent Document 1 discloses an imaging device in which a sensor for obtaining visible-light data and a sensor for obtaining infrared-light data overlap with each other.

A technique for forming a transistor by using an oxide semiconductor thin film formed over a substrate has attracted attention. For example, Patent Document 2 discloses an imaging device with a structure in which a transistor including an oxide semiconductor and having an extremely low off-state current is used in a pixel circuit.

REFERENCE

Patent Document

[Patent Document 1] Japanese Published Patent Application No. 2013-068606
[Patent Document 2] Japanese Published Patent Application No. 2011-119711

SUMMARY OF THE INVENTION

Problems to be Solved by the Invention

In a pixel of a solid-state imaging device such as a CMOS image sensor, subpixels for obtaining data of incident light that is separated into components of three primary colors (red (R), green (G), and blue (B)) are provided. Color image data can be generated owing to the subpixels. In general, many subpixels for obtaining data of G with a high luminosity factor are provided in order to obtain luminance data accurately. For example, a structure is employed in which one pixel includes four subpixels of R•G•G B arrangement.

The components of R, G, and B can be separated from each other using color filters. Furthermore, when a filter that cuts light having a higher energy than infrared light is used, infrared-light (IR) data can also be obtained. In order to obtain a color image and an infrared image at the same time, a subpixel for infrared light is needed in addition to subpixels for colors.

Accordingly, the structure of subpixels is R•G•G•B•IR arrangement or R•G•B•IR arrangement. The former includes five subpixels and thus the number of total pixels is decreased and the definition is decreased as compared to an image sensor of the same size having R•G•G•B arrangement. The latter includes the same number of pixels but has an inferior function of obtaining luminance data in a similar comparison.

Accordingly, an object of one embodiment of the present invention is to provide an imaging device that can capture a high-definition color image and a high-definition infrared image. Another object is to provide an imaging device that has an excellent function of obtaining luminance data and can capture a color image and an infrared image. Another object is to provide an imaging device that has high infrared light sensitivity and can capture a color image and an infrared image.

Another object is to provide a highly reliable imaging device. Another object is to provide a novel imaging device or the like. Another object is to provide a method for operating the above imaging device. Another object is to provide a novel semiconductor device or the like.

Note that the description of these objects does not preclude the existence of other objects. One embodiment of the present invention does not have to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention relates to an imaging device that has a structure in which a photoelectric conversion device capturing color-image data and a photoelectric conversion device capturing an infrared image overlap with each other.

One embodiment of the present invention is an imaging device including a first layer and a second layer. The first layer includes a first transistor, a second transistor, a third transistor, a fourth transistor, a fifth transistor, a first photoelectric conversion device, a second photoelectric conversion device, a third photoelectric conversion device, and a fourth photoelectric conversion device. The second layer includes a fifth photoelectric conversion device. The first transistor to the fifth transistor each include silicon in a channel formation region. The first photoelectric conversion device to the fourth photoelectric conversion device each include silicon in a photoelectric conversion layer. The second photoelectric conversion device includes an organic photoconductive film in the photoelectric conversion layer. The first transistor is electrically connected to the first photoelectric conversion device. The second transistor is electrically connected to the second photoelectric conversion device. The third transistor is electrically connected to the third photoelectric conversion device. The fourth transistor is electrically connected to the fourth photoelectric conversion device. The fifth transistor is electrically connected to the fifth photoelectric conversion device. The fifth photoelectric conversion device includes a region overlapping with each of the first photoelectric conversion device to the fourth photoelectric conversion device.

Another embodiment of the present invention is an imaging device including a first layer, a second layer, and a third layer. The third layer is provided between the first layer and the second layer. The first layer includes a first transistor, a second transistor, a third transistor, a fourth transistor, a first photoelectric conversion device, a second photoelectric conversion device, a third photoelectric conversion device, and a fourth photoelectric conversion device. The second layer includes a fifth photoelectric conversion device. The third layer includes a fifth transistor. The first transistor to the fourth transistor each include silicon in a channel formation region. The fifth transistor includes a metal oxide in a channel formation region. The first photoelectric conversion device to the fourth photoelectric conversion device each include silicon in a photoelectric conversion layer. The fifth photoelectric conversion device includes an organic photoconductive film in a photoelectric conversion layer. The first transistor is electrically connected to the first photoelectric conversion device. The second transistor is electrically connected to the second photoelectric conversion device. The third transistor is electrically connected to the third photoelectric conversion device. The fourth transistor is electrically connected to the fourth photoelectric conversion device. The fifth transistor is electrically connected to the fifth photoelectric conversion device. The fifth photoelectric conversion device includes a region overlapping with each of the first photoelectric conversion device to the fourth photoelectric conversion device.

The fifth photoelectric conversion device can include a photoelectric conversion layer that generates electric charge by absorbing infrared light. The photoelectric conversion layer of the fifth photoelectric conversion device preferably has a visible-light transmitting property.

It is possible in the above structure that a fourth layer is further included, the fourth layer is provided between the third layer and the second layer, and the fourth layer includes a color filter.

It is preferable that the metal oxide include In, Zn, and M (M is one or more of Al, Ti, Ga, Ge, Sn, Y, Zr, La, Ce, Nd, and Hf).

Effect of the Invention

By using one embodiment of the present invention, an imaging device that can capture a high-definition color image and a high-definition infrared image at the same time can be provided. Alternatively, an imaging device that has an excellent function of obtaining luminance data and can capture a color image and an infrared image at the same time can be provided. Alternatively, an imaging device that has high infrared light sensitivity and can capture a color image and an infrared image at the same time can be provided.

Alternatively, a highly reliable imaging device can be provided. Alternatively, a novel imaging device or the like can be provided. Alternatively, a method for operating the above imaging device can be provided. Alternatively, a novel semiconductor device or the like can be provided.

BRIEF DESCRIPTION OF THE DRAWINGS

FIG. 19A1 to FIG. 19A3 and FIG. 19B1 to FIG. 19B3 are perspective views of a package and a module in each of which an imaging device is placed.

MODE FOR CARRYING OUT THE INVENTION

Figure 1:
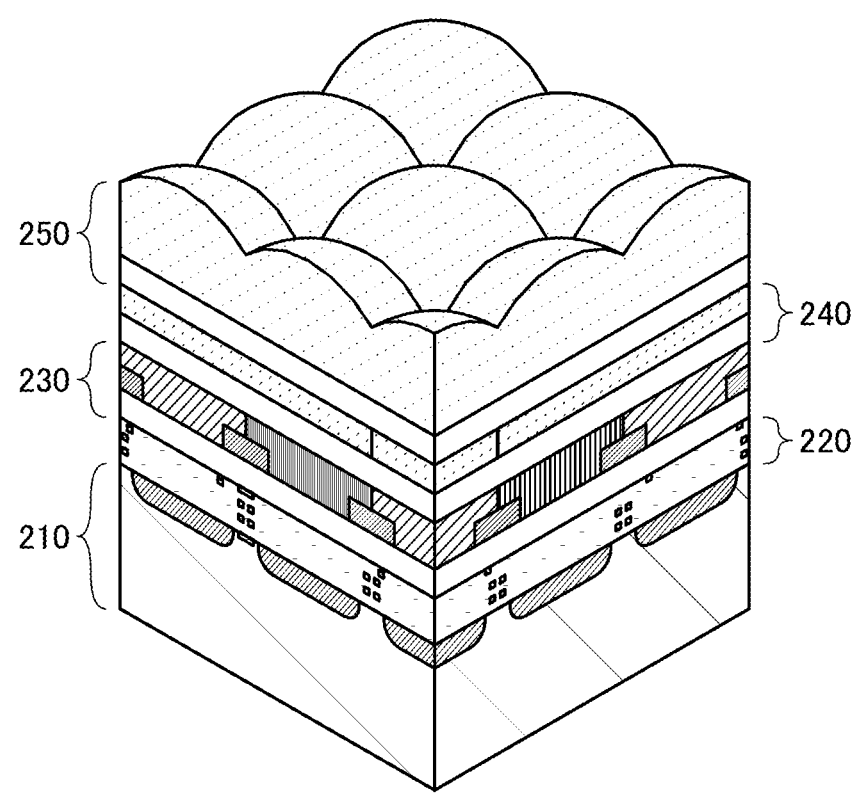
FIG. 1 is a diagram illustrating a pixel.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one conductor or a plurality of conductors. In this specification, even such a configuration is included in direct connection.

Embodiment 1

In this embodiment, an imaging device of one embodiment of the present invention is described with reference to drawings.

One embodiment of the present invention is an imaging device having a color imaging function and an infrared imaging function. The imaging device has a structure in which a first photoelectric conversion device for color imaging and a second photoelectric conversion device for infrared imaging are stacked.

The second photoelectric conversion device has a function of generating electric charge by absorbing infrared light, and transmits light having a wavelength of higher energy than that of infrared light. The first photoelectric conversion device is positioned to overlap with the second photoelectric conversion device, and has a function of generating electric charge by absorbing light (visible light) passing through the second photoelectric conversion device.

Accordingly, a subpixel for color imaging and a subpixel for infrared imaging can be positioned to overlap with each other, and thus color imaging and infrared imaging can be performed at the same time without a decrease in luminance data obtaining function and the definition. In addition, only color imaging operation or only infrared imaging operation is possible.

<Stacked Structure>

FIG. 1 is a perspective view including a cross section of a pixel of the imaging device of one embodiment of the present invention. The pixel has a stacked structure, and includes a layer 210, a layer 220, a layer 230, a layer 240, and a layer 250. The layer 210 includes a pixel circuit (a photoelectric conversion device and a transistor) and the like. The layer 220 includes a wiring and the like. The layer 220 can also include part of a pixel circuit (e.g., a transistor). The layer 230 includes a color filter for visible light imaging, and the like. The layer 240 includes part of the pixel circuit for infrared imaging (e.g., a photoelectric conversion device). The layer 250 includes a microlens array and the like.

Figure 2:
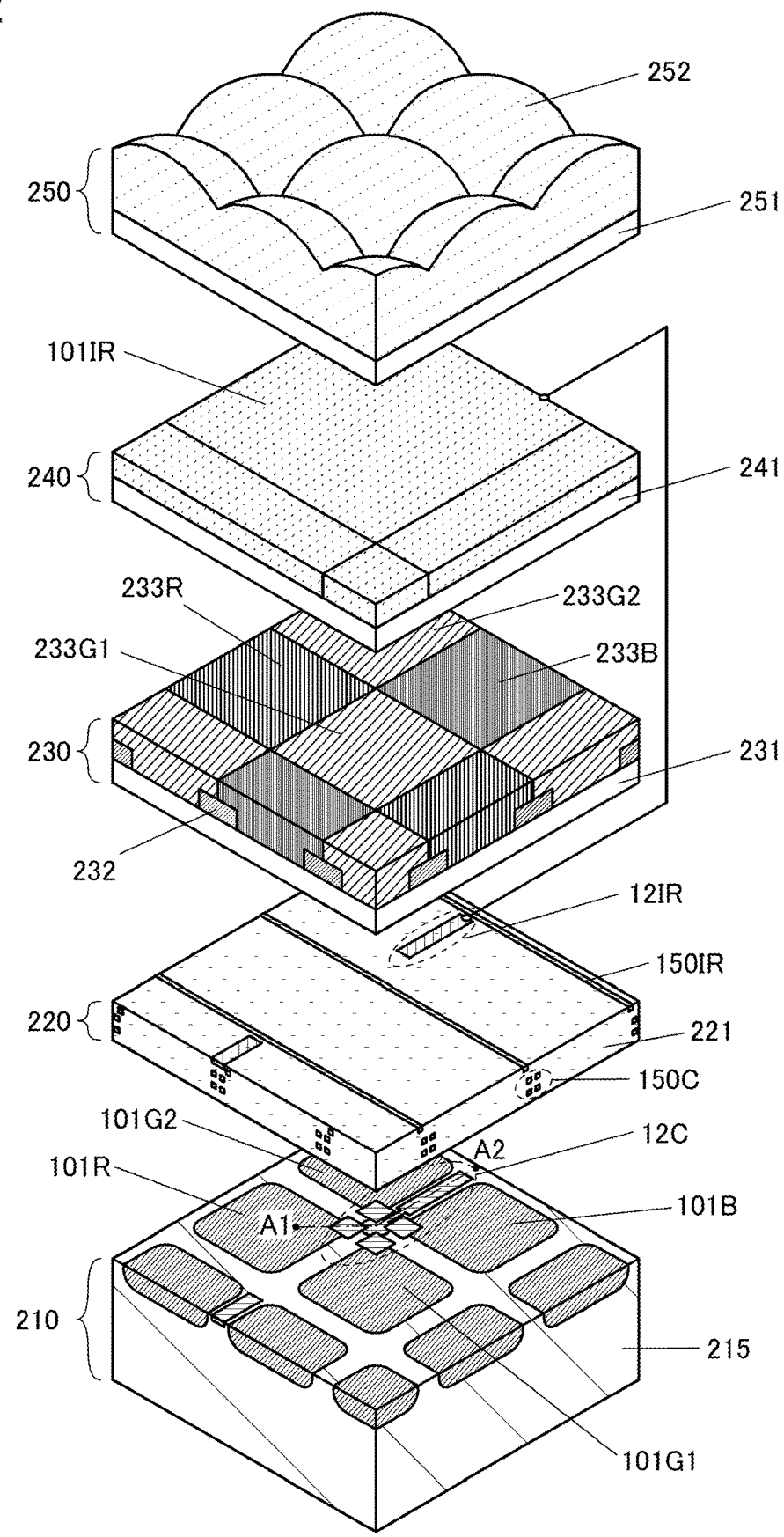
FIG. 2 is a diagram illustrating a pixel.

Detailed structures of the respective layers are described with FIG. 2. FIG. 2 illustrates the separated layers of the stacked structure illustrated in FIG. 1. Note that components included in each layer are not limited to components illustrated in FIG. 2, and another component may be included. In a structure in which two layers are in contact with each other, a component such as an insulating layer positioned near the boundary is illustrated as a component of one of the layers for convenience, but may be a component of the other of the layers.

A structure of one pixel is described below. The pixel includes four subpixels for visible light imaging and one subpixel for infrared imaging.

<Layer 210>

The layer 210 is a layer provided with the four subpixels for visible light imaging, and includes photoelectric conversion devices 101R, 101G1, 101G2, and 101B, and a circuit 12C. One subpixel includes one of the photoelectric conversion devices and part of the circuit 12C. The four subpixels share another part of the circuit 12C.

The photoelectric conversion devices 101R, 101G1, 101G2, and 101B can have the same structure. Furthermore, when they operate in combination with color filters included in the layer 230 to be described later, data for creating a color image can be obtained.

Here, the photoelectric conversion device 101R has a function of obtaining data of a red light component. The photoelectric conversion devices 101G1 and 101G2 each have a function of obtaining data of a green light component. The photoelectric conversion device 101B has a function of obtaining data of a blue light component.

The photoelectric conversion devices 101R, 101G1, 101G2, and 101B are pn-junction photodiodes provided in a silicon substrate 215. It is preferable that these photodiodes each be a pinned photodiode connected directly to a transistor without through a wiring. With this structure, electric charge accumulated in the photodiode can be completely transferred, and noise can be reduced.

The circuit 12C includes transistors electrically connected to the respective photoelectric conversion devices 101R, 101G1, 101G2, and 101B. The circuit 12C and the photoelectric conversion devices form a pixel circuit. The transistors can be provided in the silicon substrate 215. That is, the transistors can each be a transistor including silicon in a channel formation region (hereinafter, a Si transistor). The pixel circuit including the circuit 12C and the photoelectric conversion devices is described in detail later.

<Layer 220>

The layer 220 is a layer provided with wirings and components of the subpixel for infrared imaging, and includes a circuit 12IR, a wiring 150C, a wiring 15018, and an insulating layer 221. The circuit 121R is electrically connected to a photoelectric conversion device 101IR included in the layer 240 to be described later, and forms one subpixel for infrared imaging.

The circuit 121R includes a transistor electrically connected to the photoelectric conversion device 101IR. The circuit 121R and the photoelectric conversion device 101IR form a pixel circuit. A transistor including a metal oxide in a channel formation region (hereinafter, an OS transistor) can be used as the transistor. The OS transistor can be formed with a stack of thin films and can be formed over a Si device by using a process common to a wiring process or the like. The pixel circuit including the circuit 121R and the photoelectric conversion device 101IR is described in detail later.

The layer 220 can have a multilayer structure. The wiring 150C and the wiring 1501R are each provided more than one, and positioned in the insulating layer 221 or over the surface of the insulating layer 221. Note that the wirings 150C are a power supply line, a signal line, an output line, and the like electrically connected to the photoelectric conversion devices 101R, 101G1, 101G2, and 101B, the circuit 12C, and the like mainly included in the layer 210. The wirings 1501R are a power supply line, a signal line, an output line, and the like electrically connected to the photoelectric conversion device 101IR, the circuit 121R, and the like mainly included in the layer 240.

<Layer 230>

The layer 230 is a layer provided with color separation layers for color imaging, and includes color filters 233R, 233G1, 233G2, and 233B, a light-blocking layer 232, and an insulating layer 231.

The color filter 233R is colored red and provided in a region overlapping with the photoelectric conversion device 101R. The color filter 233G1 is colored green and provided in a region overlapping with the photoelectric conversion device 101G1. The color filter 233G2 is colored green and provided in a region overlapping with the photoelectric conversion device 101G2. The color filter 233B is colored blue and provided in a region overlapping with the photoelectric conversion device 101B.

The light-blocking layer 232 is provided in a position overlapping with a boundary between the color filters, and can prevent light passing through a color filter from entering an adjacent subpixel. The insulating layer 231 has functions of planarization, prevention of impurity diffusion, and the like.

<Layer 240>

The layer 240 is a layer provided with a photoelectric conversion device for infrared imaging, and includes the photoelectric conversion device 101IR and an insulating layer 241. For example, an organic photoconductive film can be used as a photoelectric conversion layer of the photoelectric conversion device 101IR. The layer 241 has functions of planarization, prevention of impurity diffusion, and the like.

The photoelectric conversion device 101IR has a feature of generating electric charge by absorbing infrared light. In addition, the photoelectric conversion device 101IR has a feature of transmitting visible light. Therefore, of light incident on the pixel, an infrared light component is absorbed by the photoelectric conversion device 101IR, and visible light components pass through the color filters 233R, 233G1, 233G2, and 233B and are absorbed by the photoelectric conversion devices 101R, 101G1, 101G2, and 101B.

Thus, the subpixels for visible light and the subpixel for infrared light can be stacked. That is, even in the case of arrangement of four (R•G•G•B) subpixels for color imaging, a subpixel for infrared imaging can be stacked thereover, whereby an infrared imaging function can be added without a decrease in color imaging quality.

Since the photoelectric conversion devices 101R, 101G1, 101G2, and 101B each include silicon in a photoelectric conversion layer, they also have sensitivity to infrared light. Although most infrared light is absorbed by the color filters 233R, 233G1, 233G2, and 233B, a slight amount of infrared light passing through the color filters degrades the quality of a color image in some cases.

In one embodiment of the present invention, most infrared light is absorbed by the photoelectric conversion device 101IR, whereby the amount of infrared light incident on the photoelectric conversion devices 101R, 101G1, 101G2, and 101B can be extremely small, improving the quality of a color image.

<Layer 250>

The layer 250 includes a microlens array 252 and an insulating layer 251. The microlens array 252 has a function of condensing incident light and making light avoid obstacles such as the light-blocking layer 232 and the wirings 150C and 15018 and efficiently enter the photoelectric conversion devices 101R, 101G1, 101G2, and 101B.

<Pixel Size>

Figure 3:
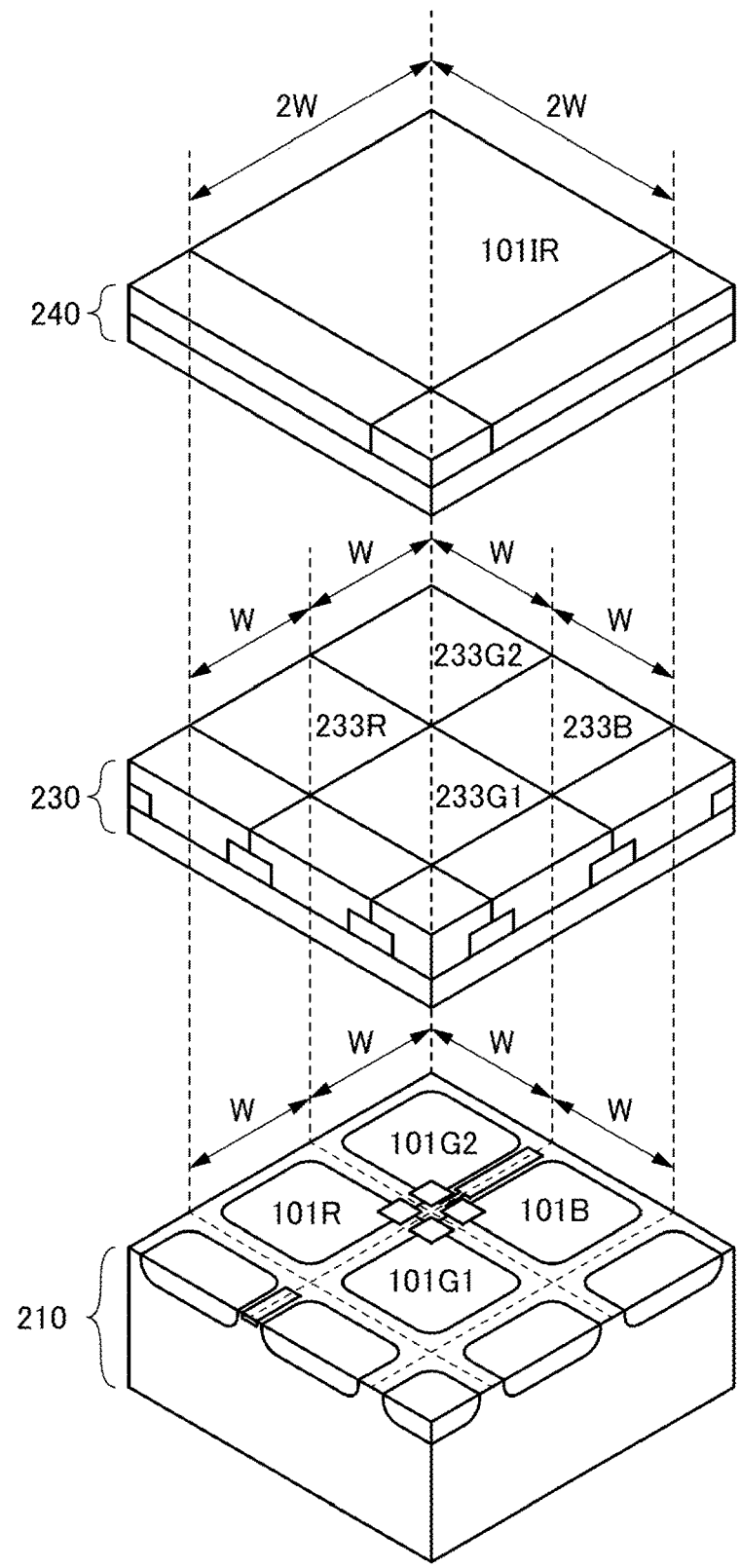
FIG. 3 is a diagram illustrating a pixel.

FIG. 3 roughly illustrates the sizes of the photoelectric conversion devices 101R, 101G1, 101G2, and 101B, the color filters 233R, 233G1, 233G2, and 233B, and the photoelectric conversion device 101IR. Note that in FIG. 3, hatching of each component is omitted for clarity.

When a subpixel is a square pixel having a length of one side of W, the top surface size of each of the color filters 233R, 233G1, 233G2, and 233B can be roughly W×W. The top surface size of each of the photoelectric conversion devices 101R, 101G1, 101G2, and 101B can be smaller than W×W. The top surface size of the photoelectric conversion device 101IR can be roughly 2W×2W.

That is, the light-receiving area of the photoelectric conversion device 101IR for infrared imaging can be roughly four or more times larger than the light-receiving area of one photoelectric conversion device for color imaging. Thus, the imaging device of one embodiment of the present invention can perform highly sensitive infrared imaging in addition to color imaging capable of capturing a high-quality image.

<Pixel Circuit>

Figure 4:
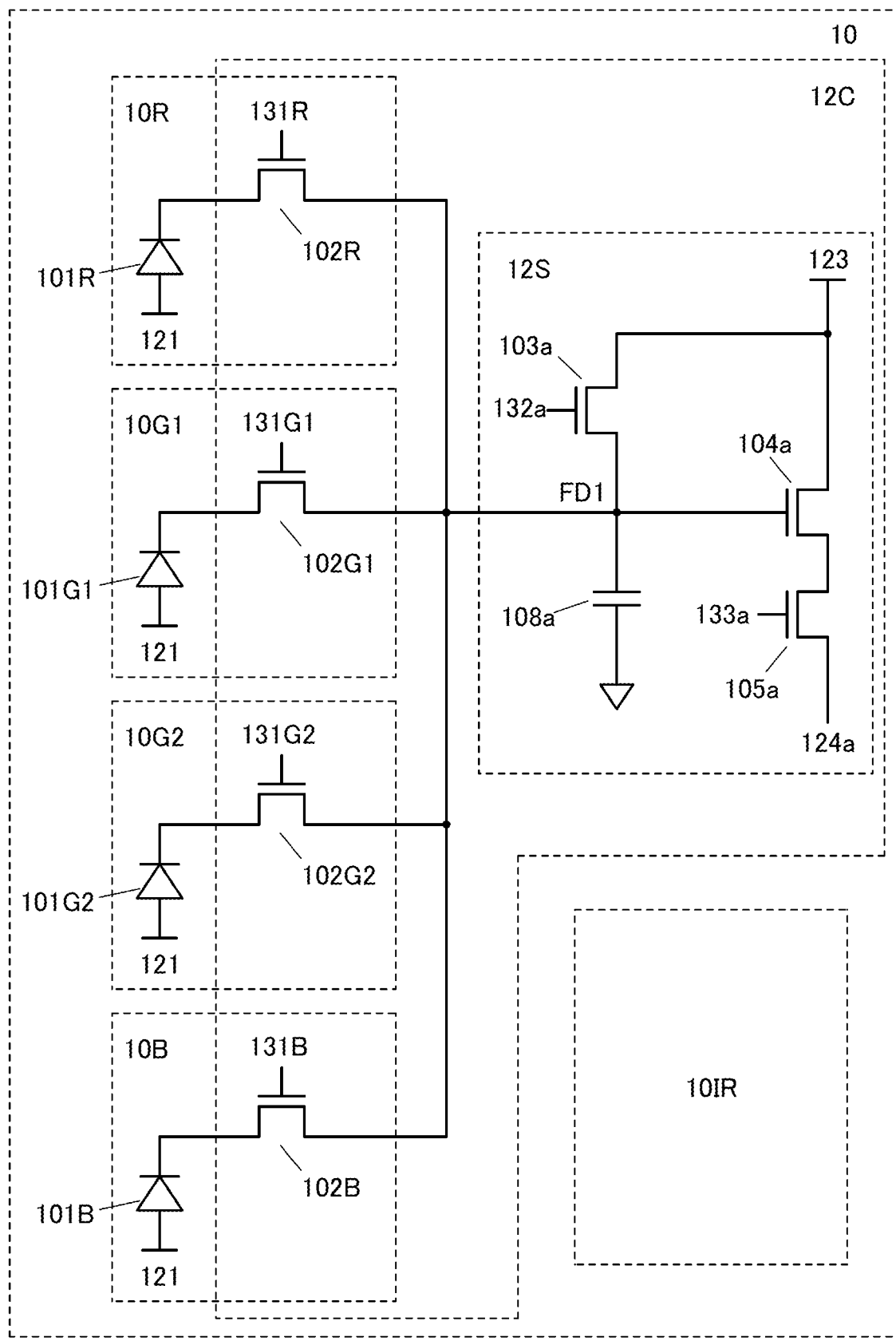
FIG. 4 is a diagram illustrating a pixel circuit.

FIG. 4 is a diagram illustrating an example of a pixel 10. The pixel 10 includes a subpixel 10R for red light, a subpixel 10G1 for green light, a subpixel 10G2 for green light, a subpixel 10B for blue light, and a subpixel 10IR for infrared light.

The subpixel 10R includes the photoelectric conversion device 101R and a transistor 102R. One electrode of the photoelectric conversion device 101R is electrically connected to one of a source and a drain of the transistor 102R. A gate of the transistor 102R is electrically connected to a wiring 131R.

The subpixel 10G1 includes the photoelectric conversion device 101G1 and a transistor 102G1. One electrode of the photoelectric conversion device 101G1 is electrically connected to one of a source and a drain of the transistor 102G1. A gate of the transistor 102G1 is electrically connected to a wiring 131G1.

The subpixel 10G2 includes the photoelectric conversion device 101G2 and a transistor 102G2. One electrode of the photoelectric conversion device 101G2 is electrically connected to one of a source and a drain of the transistor 102G2. A gate of the transistor 102G2 is electrically connected to a wiring 131G2.

The subpixel 10B includes the photoelectric conversion device 101B and a transistor 102B. One electrode of the photoelectric conversion device 101B is electrically connected to one of a source and a drain of the transistor 102B. A gate of the transistor 102B is electrically connected to a wiring 131B.

In addition, the subpixels other than the subpixel 10IR include a circuit 12S as a common component. The circuit 12S includes a transistor 103a, a transistor 104a, a transistor 105a, and a capacitor 108a. Here, the transistor 102R, the transistor 102G1, the transistor 102G2, the transistor 102B, and the circuit 12S are components of the circuit 12C illustrated in FIG. 2.

One of a source and a drain of the transistor 103a is electrically connected to a gate of the transistor 104a, one electrode of the capacitor 108a, the other of the source and the drain of the transistor 102R, the other of the source and the drain of the transistor 102G1, the other of the source and the drain of the transistor 102G2, and the other of the source and the drain of the transistor 102B. One of a source and a drain of the transistor 104a is electrically connected to one of a source and a drain of the transistor 105a.

Here, a point where the one of the source and the drain of the transistor 103a, the gate of the transistor 104a, the one electrode of the capacitor 108a, the other of the source and the drain of the transistor 102R, the other of the source and the drain of the transistor 102G1, the other of the source and the drain of the transistor 102G2, and the other of the source and the drain of the transistor 102B are electrically connected is a node FD1. The node FD1 can function as a charge detection portion.

The other electrode of each of the photoelectric conversion devices 101R, 101G1, 101G2, and 101B is electrically connected to a wiring 121. The other of the source and the drain of the transistor 103a is electrically connected to a wiring 123. The other of the source and the drain of the transistor 104a is electrically connected to the wiring 123. The other of the source and the drain of the transistor 105a is electrically connected to a wiring 124a.

A gate of the transistor 103a is electrically connected to a wiring 132a. A gate of the transistor 105a is electrically connected to a wiring 133a.

The wirings 121 and 123 can each function as a power supply line. In the structure illustrated in FIG. 4, the wiring 121 can be a low-potential power supply line, and the wiring 123 can be a high-potential power supply line.

The wirings 131R, 131G1, 131G2, 131B, 132a, and 133a can function as signal lines for controlling conduction of the respective transistors. The wiring 124a can function as an output line, and is electrically connected to a read circuit including a correlated double sampling circuit (CDS circuit), an A/D converter circuit, and the like, for example.

The transistors 102R, 102G1, 102G2, and 102B have a function of reading out electric charge from the respective photoelectric conversion devices connected thereto and controlling the potential of the node FD1. The transistor 103a has a function of resetting the potential of the node FD1. The transistor 104a functions as a component of a source follower circuit. The transistor 105a has a function of selecting output of the pixel.

When the subpixels 10R, 10G1, 10G2, and 10B share the circuit 12S, the number of transistors per subpixel can be reduced and the definition can be increased. The node FD1 is shared by the subpixels 10R, 10G1, 10G2, and 10B in the structure of FIG. 4, and thus rolling shutter operation in which timings of imaging of respective subpixels are different can be performed.

Figure 7A:
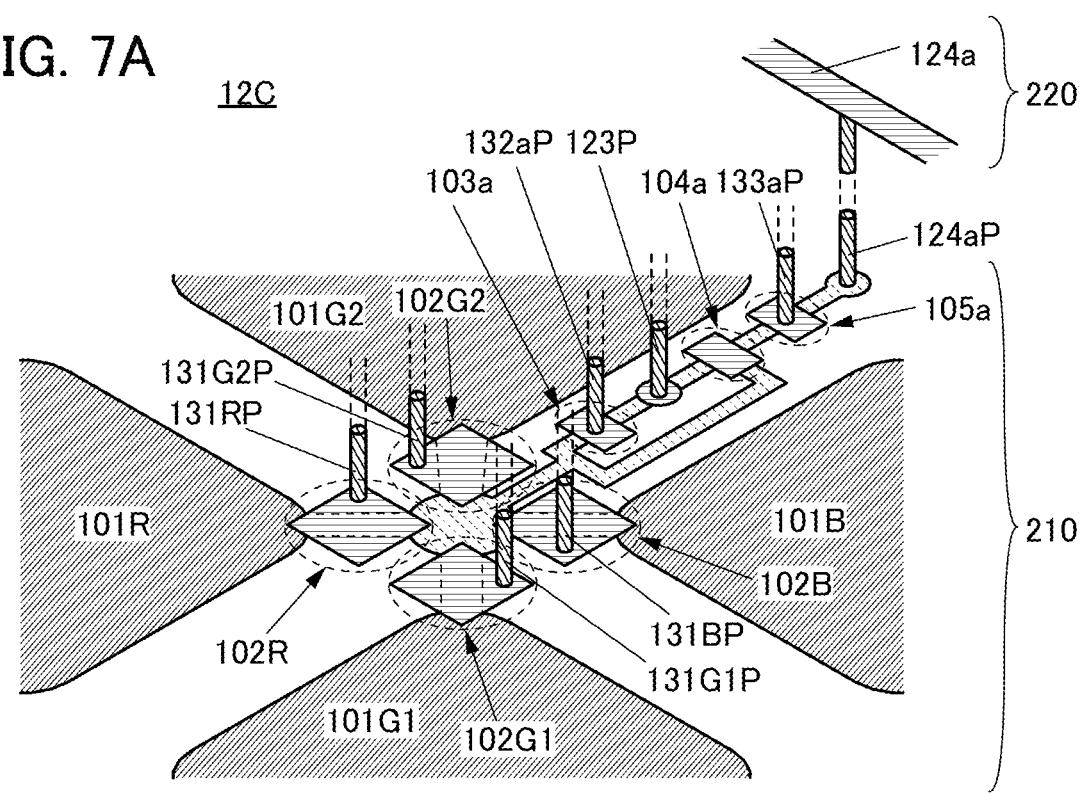
FIG. 7A and FIG. 7B are diagrams illustrating layouts of a pixel circuit.

FIG. 7A is a perspective view of a simple layout of the circuit 12C illustrated in FIG. 2 and FIG. 4. The transistors provided in the layer 210 are electrically connected to the wirings through plugs. FIG. 7A illustrates a specific example in which the other of the source and the drain of the transistor 105a provided in the layer 210 is connected to the wiring 124a provided in the layer 220 through a plug 124aP.

Although not illustrated in FIG. 7A, a plug 131RP electrically connected to the gate of the transistor 102R is electrically connected to the wiring 131R provided in the layer 220. A plug 131G1P electrically connected to the gate of the transistor 102G1 is electrically connected to the wiring 131G1 provided in the layer 220. A plug 131G2P electrically connected to the gate of the transistor 102G2 is electrically connected to the wiring 131G2 provided in the layer 220. A plug 131BP electrically connected to the gate of the transistor 102B is electrically connected to the wiring 131B provided in the layer 220.

A plug 132aP electrically connected to the gate of the transistor 103a is electrically connected to the wiring 132a provided in the layer 220. A plug 133aP electrically connected to the gate of the transistor 104a is electrically connected to the wiring 133a provided in the layer 220. A plug 123P electrically connected to the other of the source and the drain of the transistor 104a is electrically connected to the wiring 123 provided in the layer 220.

Figure 5A:
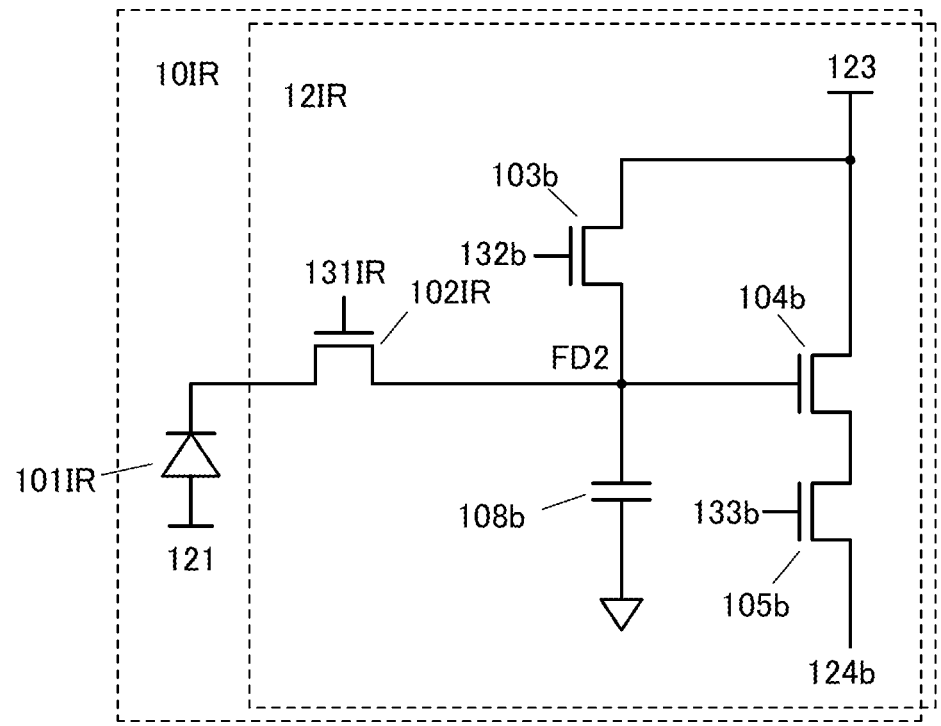
FIG. 5A and FIG. 5B are diagrams illustrating pixel circuits.

FIG. 5A illustrates an example of a circuit diagram of the subpixel 10IR. The subpixel 10IR includes the photoelectric conversion device 101IR, a transistor 1021S, a transistor 103b, a transistor 104b, a transistor 105b, and a capacitor 108b. Here, the transistor 1021R, the transistor 103b, the transistor 104b, the transistor 105b, and the capacitor 108b are components of the circuit 121R illustrated in FIG. 3.

One electrode of the photoelectric conversion device 101IR is electrically connected to one of a source and a drain of the transistor 1021S. The other of the source and the drain of the transistor 1021R is electrically connected to one of a source and a drain of the transistor 103b, a gate of the transistor 104b, and one electrode of the capacitor 108b. One of a source and a drain of the transistor 105b is electrically connected to the other of the source and the drain of the transistor 105b.

Here, a point where the one of the source and the drain of the transistor 1021R, the one of the source and the drain of the transistor 103b, the gate of the transistor 104b, and the one electrode of the capacitor 108b are electrically connected is a node FD2. The node FD2 can function as a charge detection portion.

The other electrode of the photoelectric conversion device 101IR is electrically connected to the wiring 121. The other of the source and the drain of the transistor 103b is electrically connected to the wiring 123. The other of the source and the drain of the transistor 104b is electrically connected to the wiring 123. The other of the source and the drain of the transistor 105b is electrically connected to a wiring 124b.

A gate of the transistor 1021R is electrically connected to a wiring 131IR. A gate of the transistor 103b is electrically connected to a wiring 132b. A gate of the transistor 105b is electrically connected to a wiring 133b.

The wirings 121 and 123 can each function as a power supply line. In the structure illustrated in FIG. 5A, the wiring 121 can be a low-potential power supply line, and the wiring 123 can be a high-potential power supply line.

The wirings 131IR, 132b, and 133b can function as signal lines for controlling conduction of the respective transistors. The wiring 124b can function as an output line, and is electrically connected to a read circuit including a correlated double sampling circuit (CDS circuit), an A/D converter circuit, and the like, for example.

The transistor 1021R has a function of reading out electric charge from the photoelectric conversion device 101IR and controlling the potential of the node FD2. The transistor 103b has a function of resetting the potential of the node FD2. The transistor 104b functions as a component of a source follower circuit. The transistor 105b has a function of selecting output of the pixel.

Figure 7B:
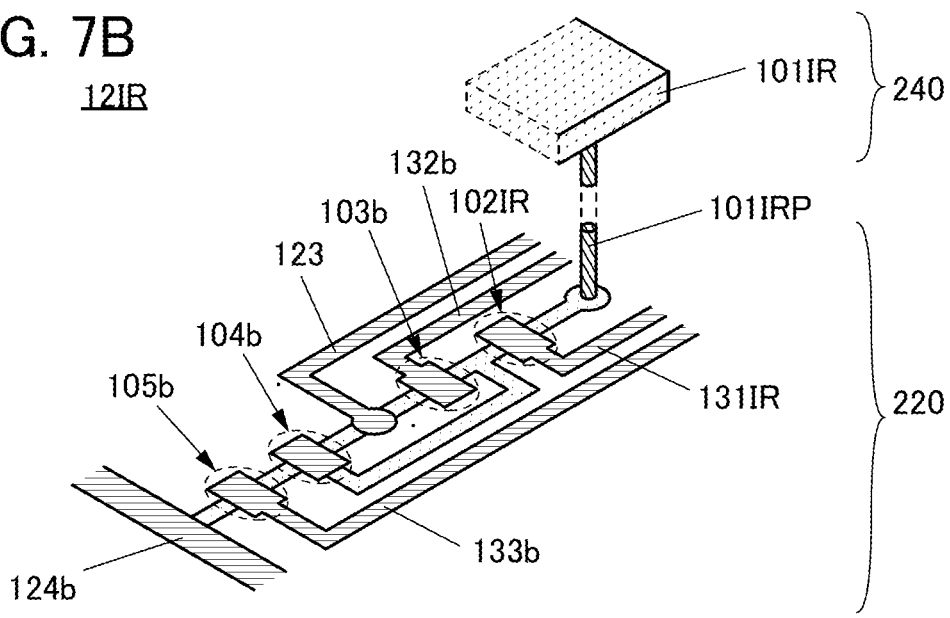

FIG. 7B is a perspective view of a simple layout of the circuit 12IR illustrated in FIG. 2 and FIG. 5A. The transistors provided in the layer 220 are electrically connected to the wirings provided in the layer 220. Although not illustrated, the transistors may be electrically connected to wirings embedded in the layer 220 through a contact hole or a plug. FIG. 7B illustrates a specific example in which the one of the source and the drain of the transistor 1021R provided in the layer 220 is connected to the photoelectric conversion device 101IR provided in the layer 240 through a plug 101IRP.

Figure 5B:
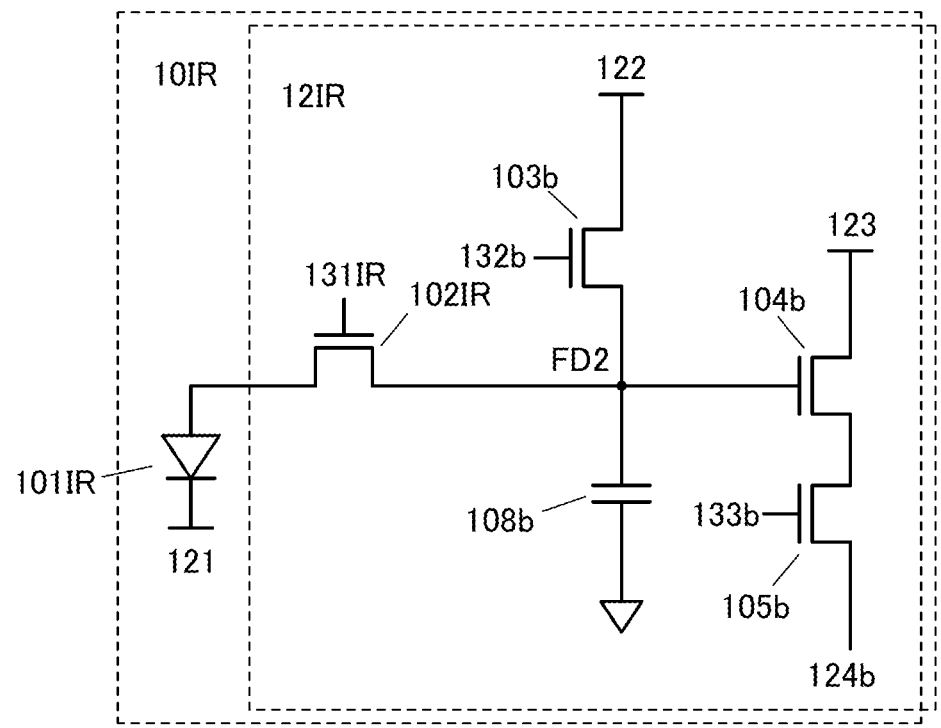

In the circuit of the subpixel 10IR, the connection relation of the cathode and the anode of the photoelectric conversion device 101IR in FIG. 5A may be reversed as illustrated in FIG. 5B. In this case, the other of the source and the drain of the transistor 103b is electrically connected to a wiring 122, the wirings 121 and 123 are high-potential power supply lines, and the wiring 122 is a low-potential power supply line.

Similarly, the connection directions of the photoelectric conversion devices in the subpixels 10R, 10G1, 10G2, and 10B illustrated in FIG. 4 may be reversed. In that case, the other of the source and the drain of the transistor 103a is electrically connected to the wiring 122 (see FIG. 5B), the wirings 121 and 123 are high-potential power supply lines, and the wiring 122 is a low-potential power supply line.

OS transistors are preferably used as the transistors included in the subpixel 10IR. The OS transistor has a characteristic of an extremely low off-state current. In particular, transistors having low off-state current are preferably used as the transistors 1021R and 103b. When these transistors are OS transistors, a period during which the node FD2 can retain electric charge can be extremely lengthened, and image data with little deterioration can be read out. That is, global shutter operation in which all pixels concurrently perform imaging operation is possible.

Figure 6:
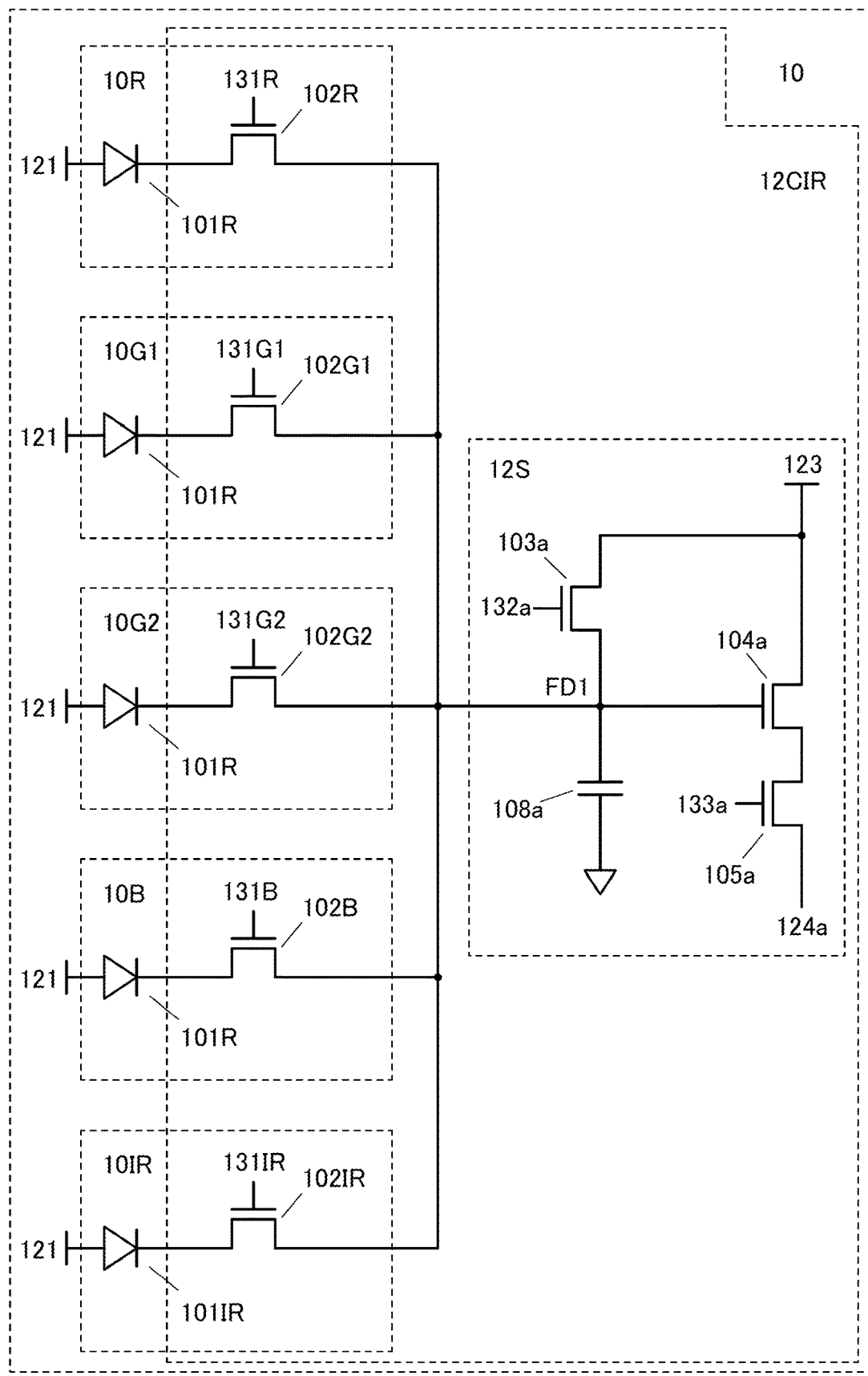
FIG. 6 is a diagram illustrating a pixel circuit.

Note that as illustrated in FIG. 6, the pixel 10 may have a structure in which the subpixels 10R, 10G1, 10G2, 10B, and 10IR share the circuit 12S. In this case, the subpixel 10IR also performs rolling shutter operation.

Figure 8:
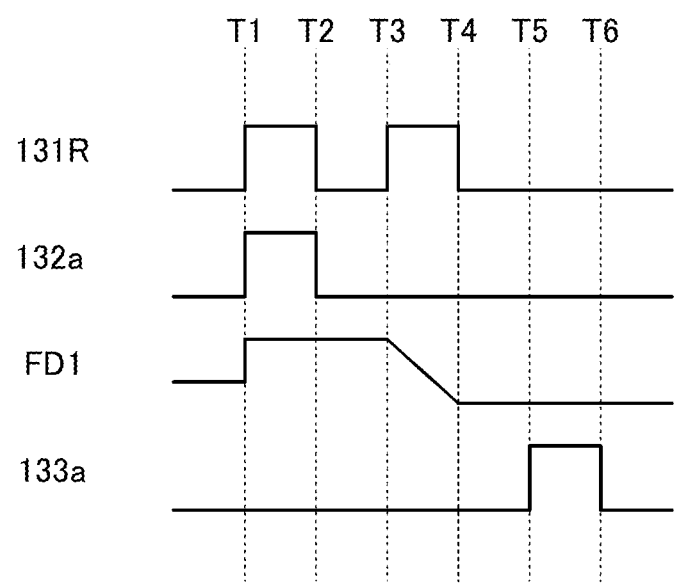
FIG. 8 is a timing chart showing the operation of a pixel.

FIG. 8 is a timing chart showing an example of the operation of one subpixel. Here, the operation of the subpixel 10R illustrated in FIG. 3 is described as an example, and the same can apply to the other subpixels. Note that in the description below, "H" represents a potential for turning on a transistor, and "L" represents a potential for turning off a transistor. In addition, the wiring 123 is continuously supplied with a high potential (e.g., VDD), and the wiring 121 is continuously supplied with a low potential (e.g., VSS).

At time T1, when the potential of the wiring 131R is set to "H" and the potential of the wiring 132a is set to "H", the transistor 102G1 and the transistor 103a are turned on and the potentials of the node FD1 and the cathode of the photoelectric conversion device 101R are reset to high potentials.

At time T2, when the potential of the wiring 131R is set to "L" and the potential of the wiring 132a is set to "L", the transistor 102R is turned off and the photoelectric conversion device 101R starts to accumulate electric charge in accordance with the intensity of emitted light. In addition, the transistor 103a is turned off and the potential of the node FD1 is retained.

At time T3, when the potential of the wiring 131R is set to "H", the transistor 102R is turned on, and the electric charge accumulated in the cathode of the photoelectric conversion device 101R is transferred to the node FD1. At this time, the potential of the node FD1 decreases in accordance with the amount of transferred electric charge.

At time T4, when the potential of the wiring 131R is set to "L", the transistor 102R is turned off, and the potential of the node FD1 is determined and retained.

At time T5, when the potential of the wiring 133a is set to "H", the transistor 105a is turned on, the transistor 104a operates in accordance with the potential of the node FD1, and data is output to the wiring 124a. At Time T6, the potential of the wiring 133a is set to "L" to turn off the transistor 105a. The above is the description of the imaging operations of the subpixel.

<Modification Example of Stacked Structure>

Figure 9:
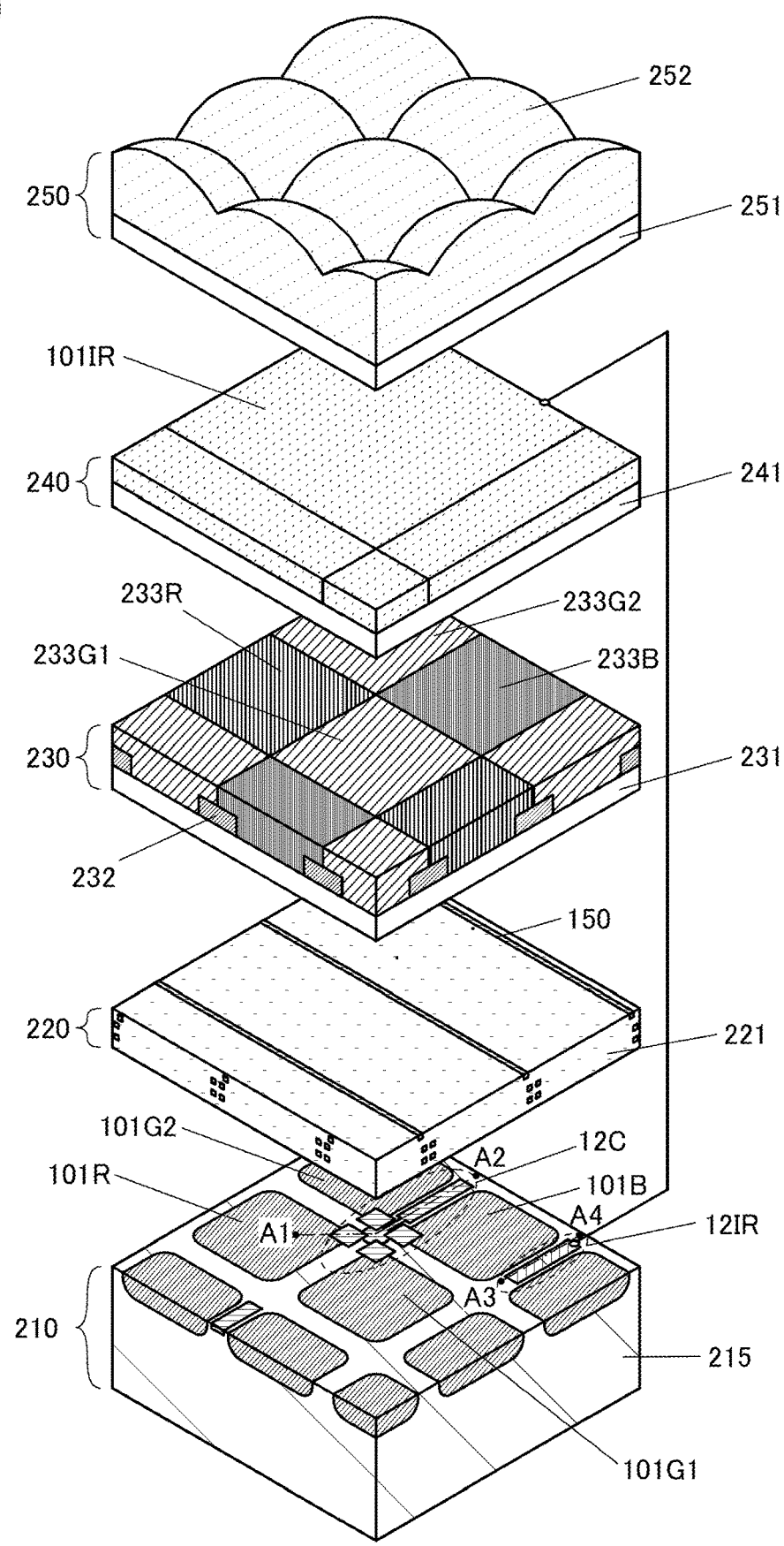
FIG. 9 is a diagram illustrating a pixel.

The stacked structure of FIG. 2 is an example in which the circuit 12IR using the OS transistors is provided in the layer 220; the circuit 121R may be provided in the layer 210 as illustrated in FIG. 9. In this case, the circuit 121R can be formed using Si transistors. In the layer 220, wirings 150 are provided and the OS transistor is not provided. Note that the wirings 150 are a power supply line, a signal line, an output line, and the like connected to the circuit 12C or the circuit 12IR.

Figure 10A:
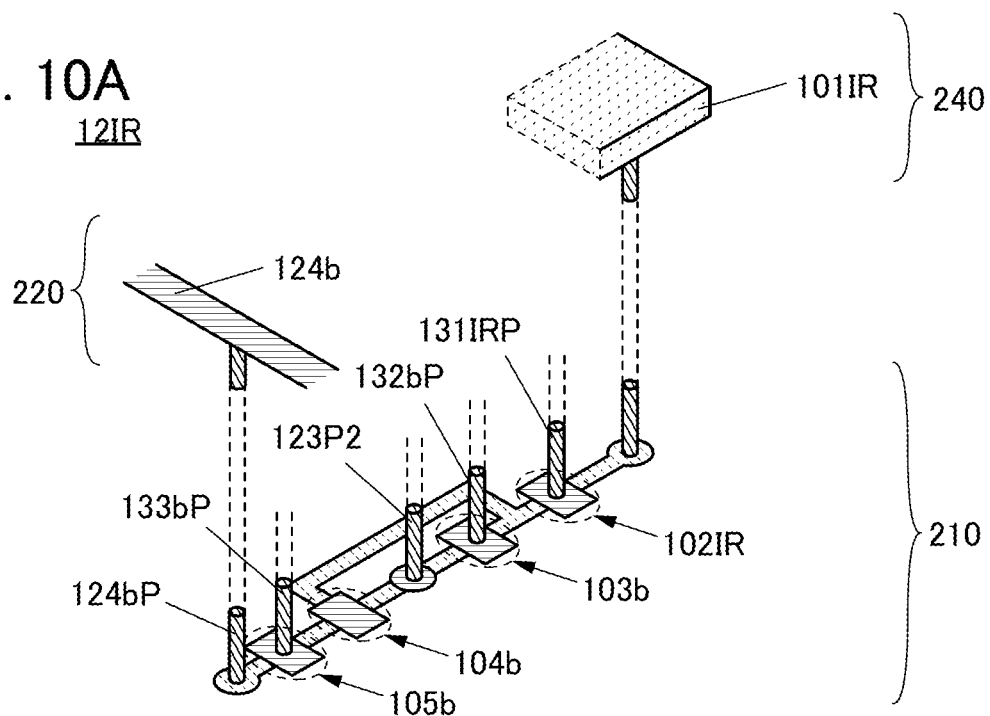
FIG. 10A and FIG. 10B are diagrams illustrating layouts of a pixel circuit.

FIG. 10A is a perspective view of a simple layout of the circuit 121R illustrated in FIG. 9. Note that FIG. 5A and FIG. 5B can be referred to for the circuit structure of the circuit 121R.

The other of the source and the drain of the transistor 105b provided in the layer 210 is electrically connected to the wiring 124b provided in the layer 220 through a plug 124bP. The one of the source and the drain of the transistor 1021R is electrically connected to the photoelectric conversion device 101IR through the plug 101IRP.

Although not illustrated in FIG. 10A, a plug 132bP electrically connected to the gate of the transistor 103b is electrically connected to the wiring 132b provided in the layer 220. A plug 133bP electrically connected to the gate of the transistor 104b is electrically connected to the wiring 133b provided in the layer 220. A plug 123P2 electrically connected to the other of the source and the drain of the transistor 104b is electrically connected to the wiring 123 provided in the layer 220.

In the structure illustrated in FIG. 9 and FIG. 10A, the circuit 12C and the circuit 121R are provided independently of each other, and thus parallel operation of color imaging and infrared imaging is possible.

Figure 10B:
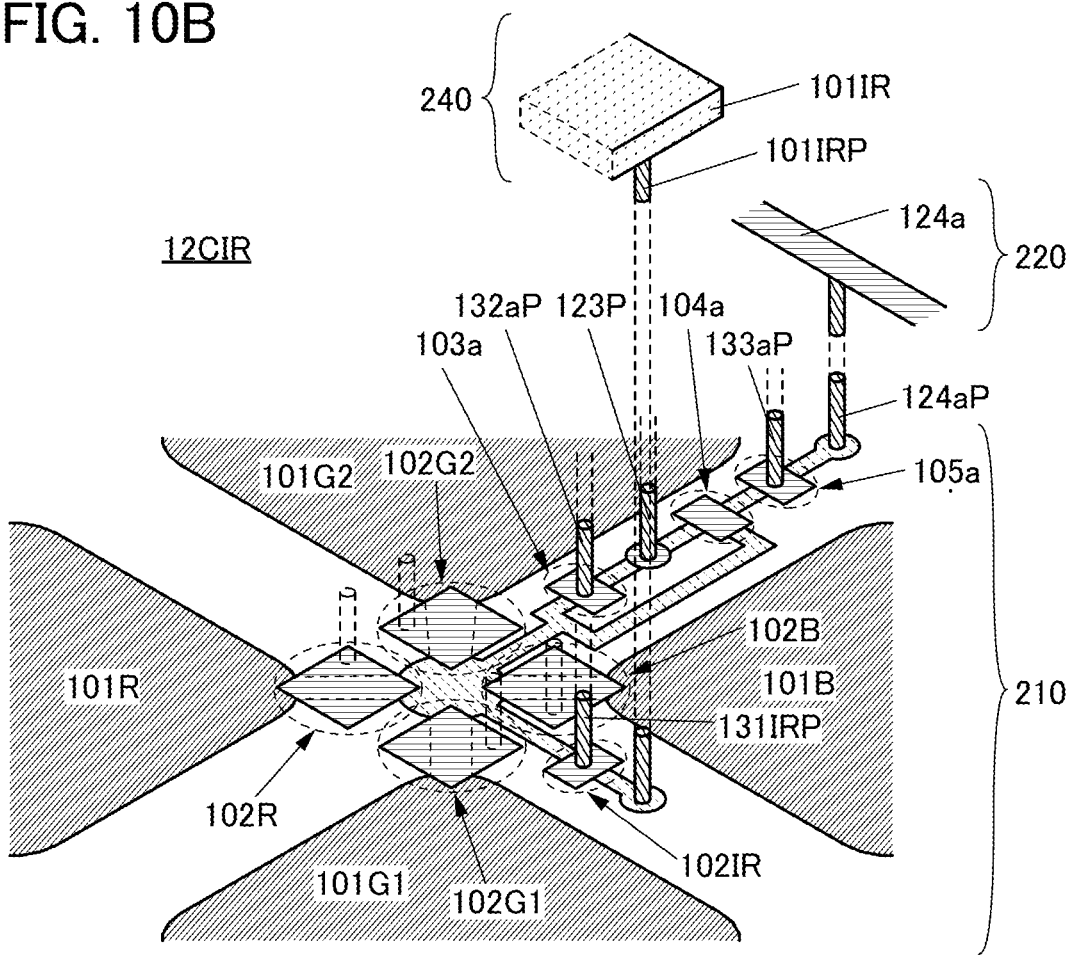

As a structure different from that of FIG. 9 and FIG. 10A, a circuit 12CIR may be provided in the layer 210 as illustrated in FIG. 10B. The circuit 12CIR has a structure in which the transistor 1021R is added to the structure of the circuit 12C, and has the circuit structure illustrated in FIG. 6. Note that for clarity of the drawing, in FIG. 10B, some components are illustrated by dashed lines and reference numerals thereof are omitted. FIG. 7A can be referred to for those components.

The one of the source and the drain of the transistor 1021R is connected to the node FD1 (see FIG. 6). The other of the source and the drain of the transistor 1021R is electrically connected to the photoelectric conversion device 101IR through the plug 101IRP. The gate of the transistor 1021R is electrically connected to the wiring 131IR through a plug 131IRP.

FIG. 10B illustrates a structure in which the circuit 12S (see FIG. 6) is shared by the five subpixels (the subpixels 10R, 10G1, 10G2, 10B, and 10IR) and which enables a reduction in the area of the whole pixel circuit. Thus, the definition can be easily increased.

Thus, all the whole pixel circuits can be formed using Si transistors. Accordingly, the manufacturing process can be simplified. Since Si transistors having high mobility can be used in all the pixel circuits, the imaging device can operate at high speed.

<Structure of Imaging Device>

Figure 11:
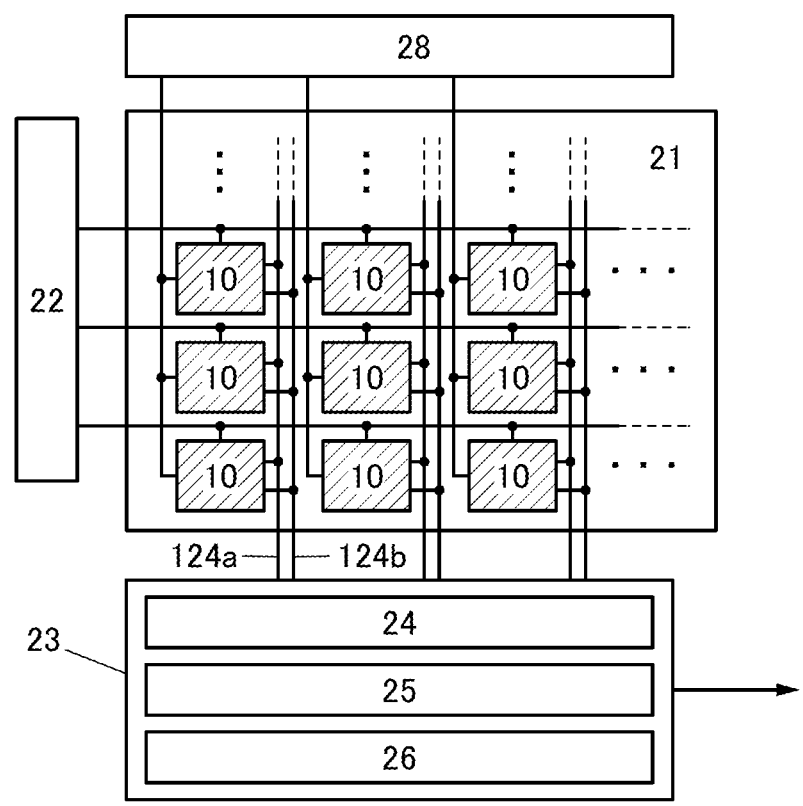
FIG. 11 is a block diagram illustrating an imaging device.

FIG. 11 is a block diagram illustrating the imaging device of one embodiment of the present invention. The imaging device includes a pixel array 21 including the pixels 10 arranged in a matrix, a circuit 22 having a function of selecting a row of the pixel array 21 (row driver), a circuit 23 having a function of reading out data from the pixels 10, and a circuit 28 for supplying a power supply potential. Note that the number of wirings connected to each component is reduced in FIG. 11. The number of each of the circuits 22, 23, and 28 may be more than one.

The circuit 23 can include a circuit 24 for performing correlated double sampling processing on output data of the pixel 10 (CDS circuit), a circuit 25 having a function of converting analog data output from the circuit 24 into digital data (A/D converter circuit or the like), a circuit 26 having a function of selecting a column to which data is output (column driver), and the like. The circuit 12C in the pixel 10 and the circuit 23 are electrically connected to each other through the wiring 124a. The circuit 12IR and the circuit 23 are electrically connected to each other through the wiring 124b.

Figure 12A:
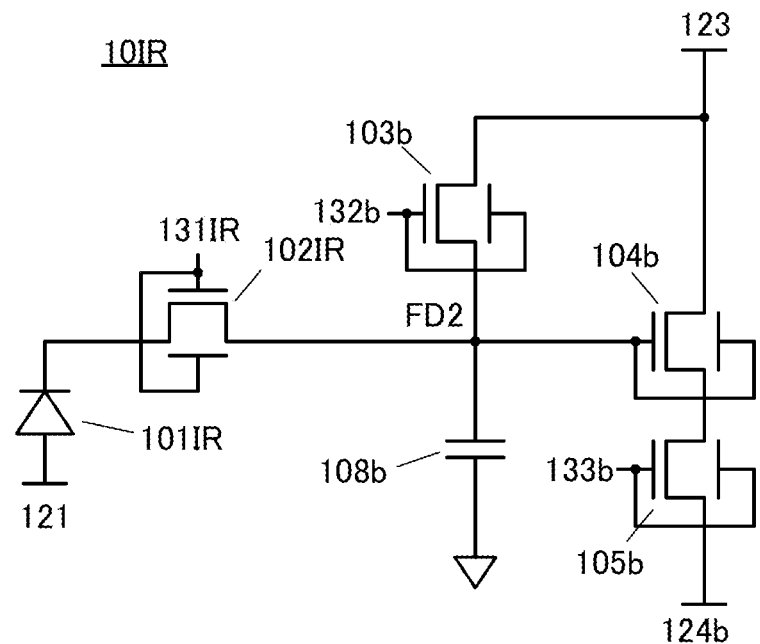
FIG. 12A and FIG. 12B are diagrams illustrating pixel circuits.
Figure 12B:
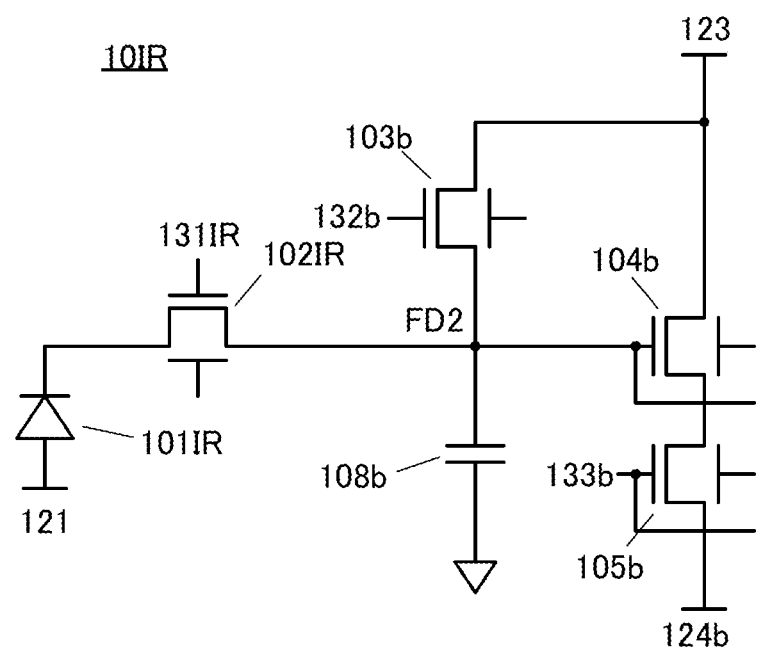

In one embodiment of the present invention, as illustrated in examples of FIG. 12A and FIG. 12B, a structure in which OS transistors are provided with back gates may be employed. FIG. 12A illustrates a structure in which back gates are electrically connected to front gates, which has an effect of increasing on-state current. Alternatively, as illustrated in FIG. 12B, a structure may be employed in which back gates are supplied with a constant potential. This structure enables control of the threshold voltages of the transistors. Furthermore, the structures of FIG. 12A and FIG.

12B may be included in one circuit. Furthermore, a transistor without a back gate may be provided.

This embodiment can be combined with the description of the other embodiments as appropriate.

Embodiment 2

In this embodiment, structure examples and the like of the imaging device of one embodiment of the present invention are described.

<Photoelectric Conversion Device>

Figure 13A:
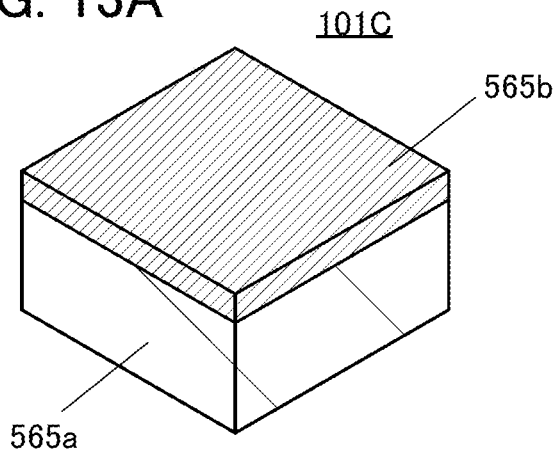
FIG. 13A and FIG. 13B are diagrams illustrating structures of photoelectric conversion devices.

A photoelectric conversion device 101C illustrated in FIG. 13A is an example of the structure that can be used as the photoelectric conversion devices 101R, 101G1, 101G2, and 101B included in the layer 210 described in Embodiment 1. The photoelectric conversion device 101C can include a layer 565a and a layer 565b. Note that the term "layer" may be replaced with the term "region" in some cases.

The photoelectric conversion device 101C is a pn-junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn-junction photodiode can be typically formed using single crystal silicon.

Figure 13B:
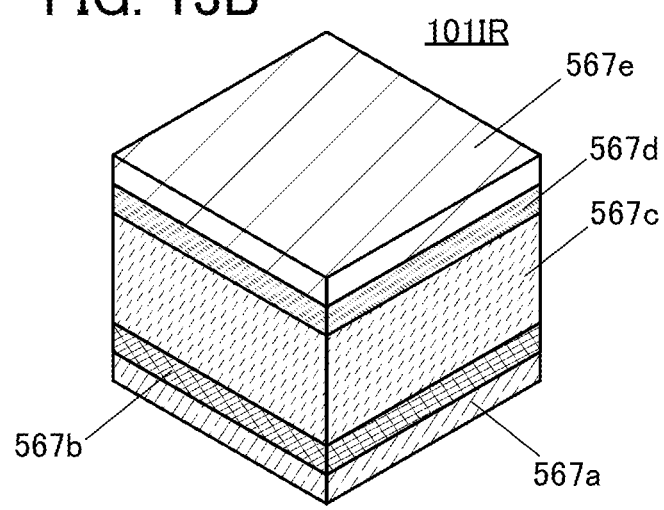

The photoelectric conversion device 101IR illustrated in FIG. 13B is an example of the structure of the photoelectric conversion device 101IR included in the layer 240 described in Embodiment 1. The photoelectric conversion device 101IR can have a stacked structure of a layer 567a, a layer 567b, a layer 567c, a layer 567d, and a layer 567e.

The photoelectric conversion device 101IR includes an organic photoconductive film in a photoelectric conversion portion. The layer 567a is a lower electrode, the layer 567e is an upper electrode, and the layers 567b, 567c, and 567d correspond to the photoelectric conversion portion.

As each of the upper electrode and the lower electrode, a conductive layer having a high visible-light transmitting property is preferably used. For example, indium oxide, tin oxide, zinc oxide, indium tin oxide, gallium zinc oxide, indium gallium zinc oxide, graphene, or the like can be used.

One of the layers 567b and 567d in the photoelectric conversion portion can be a hole-transport layer and the other can be an electron-transport layer. The layer 567c can be the photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, an organic semiconductor film that transmits visible light (e.g., the wavelength of 350 nm to 750 nm) can be used. Average transmittance in the visible light range is higher than or equal to 20% and lower than or equal to 100%, preferably higher than or equal to 50% and lower than or equal to 100%, further preferably higher than or equal to 75% and lower than or equal to 100%. A cyanine dye compound or the like can be used for the photoelectric conversion layer, for example. A cyanine dye compound has a property of absorbing a large amount of infrared light and absorbing a small amount of visible light.

Although an example in which the photoelectric conversion device having a function of generating electric charge by absorbing infrared light is provided in the layer 240 is described in Embodiment 1, a photoelectric conversion device that generates electric charge by absorbing ultraviolet light may be provided in the layer 240. Silicon carbide, an oxide semiconductor, gallium nitride, or the like that has a wider band gap than silicon can be used for a photoelectric conversion layer of the photoelectric conversion device for ultraviolet light, for example.

<OS Transistor>

The circuit 12IR included in the layer 220 described in Embodiment 1 can include an OS transistor.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, and the like do not occur, which are different from those of a Si transistor. Hence, the use of an OS transistor enables formation of a circuit having high withstand voltage and high reliability. Moreover, variations in electrical characteristics due to crystallinity unevenness, which are caused in Si transistors, are less likely to occur in OS transistors.

A semiconductor layer included in an OS transistor can be, for example, a film represented by an In-M-Zn-based oxide that contains indium, zinc, and an element M (M is one or more selected from metals such as aluminum, titanium, gallium, germanium, yttrium, zirconium, lanthanum, cerium, tin, neodymium, and hafnium). The In-M-Zn-based oxide can be formed by, for example, a sputtering method, an ALD (Atomic layer deposition) method, or an MOCVD (Metal organic chemical vapor deposition) method.

In the case where the In-M-Zn-based oxide is deposited by a sputtering method, it is preferable that the atomic ratio of the metal elements in a sputtering target satisfy In and Zn M The atomic ratio of the metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, or In:M:Zn=10:1:3. Note that the atomic ratio in the formed semiconductor layer varies from the above atomic ratio of the metal elements of the sputtering target in a range of ±40%.

An oxide semiconductor with a low carrier density is used for the semiconductor layer. For example, for the semiconductor layer, it is possible to use an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and an oxide semiconductor having an appropriate composition can be used depending on required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal (the concentration obtained by secondary ion mass spectrometry) in the semiconductor layer is set lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. If the channel formation region in the oxide semiconductor includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of the non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, is described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (of the CAC-OS, an In—Ga—Zn oxide may be particularly referred to as CAC-IGZO) has a composition in which materials are separated into indium oxide (hereinafter InO$_{X1}$, where X1 is a real number greater than 0) or indium zinc oxide (hereinafter In$_{X2}$Zn$_{Y2}$O$_{Z2}$, where X2, Y2, and Z2 are real numbers greater than 0), and gallium oxide (hereinafter GaO$_{X3}$, where X3 is a real number greater than 0) or gallium zinc oxide (hereinafter Ga$_{X4}$Zn$_{Y4}$O$_{Z4}$, where X4, Y4, and Z4 are real numbers greater than 0), for instance, to form a mosaic pattern, and InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor having a composition in which a region including GaO$_{X3}$ as a main component and a region including $In_{x2}Zn_{y2}O_{Z2}$ or $InO_{X1}$ as a main component are mixed. Note that in this specification, for example, when the atomic ratio of In to the element M in a first region is greater than the atomic ratio of In to the element M in a second region, the first region is regarded as having a higher In concentration than the second region.

Note that IGZO is a common name, which may specify a compound containing In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different compositions is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component are observed in part of a CAC-OS and nanoparticle regions containing In as a main component are observed in part of the CAC-OS, and these nanoparticle regions are randomly dispersed to form a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible, and for example, the ratio of the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using a CAC-OS has high reliability. Thus, the CAC-OS is suitably used as a constituent material of a variety of semiconductor devices.

<Stacked Structure>

Next, a stacked structure of the imaging device is described with reference to cross-sectional views. Note that components such as insulating layers and conductive layers that are described below are examples, and the imaging device may further include another component. Alternatively, some of the components described below may be omitted. The stacked structure described below can be formed by repeating a deposition step, a polishing step, and the like as needed.

Figure 14:
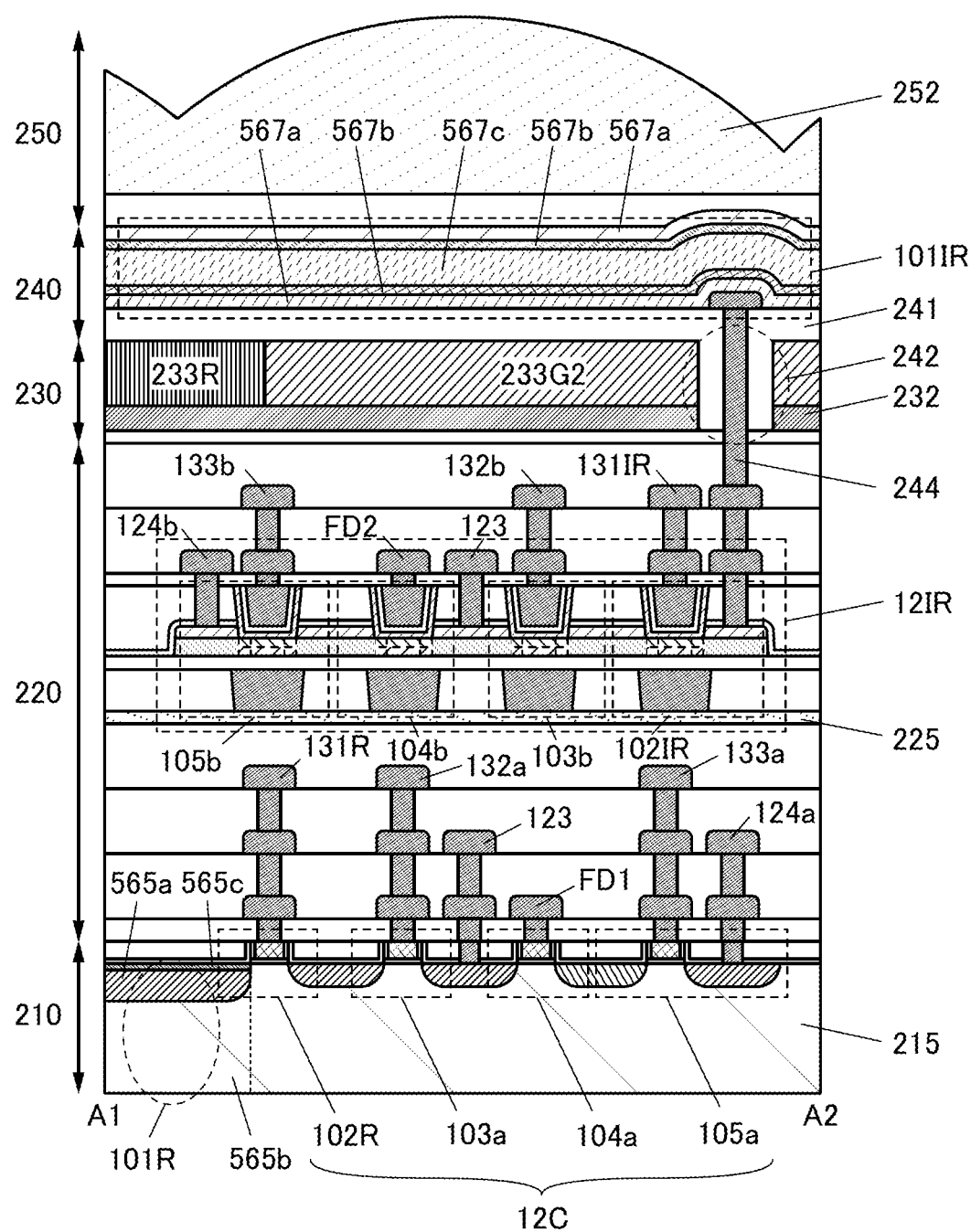
FIG. 14 is a cross-sectional view illustrating a pixel.

FIG. 14 is a cross-sectional view illustrating a plane in the height direction perpendicularly intersecting with dashed-dotted line A1-A2 shown in the layer 210 in FIG. 2.

Here, as the components of the subpixel 10R, the transistors 102R, 103a, 104a, and 105a and the photoelectric conversion device 101R are illustrated in the layer 210. Note that the structure of the subpixel 10R is described below, and the subpixel 10G1, the subpixel 10G2, and the subpixel 10B have similar structures.

Figure 15A:
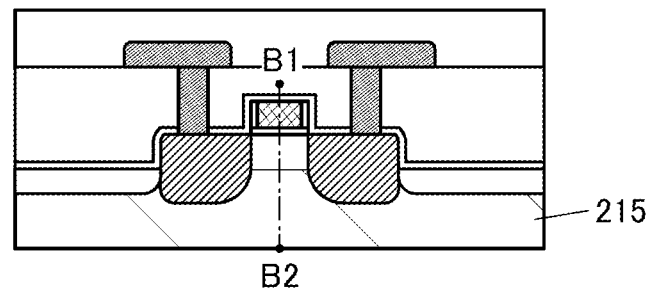
FIG. 15A to FIG. 15C are diagrams illustrating Si transistors.
Figure 15B:
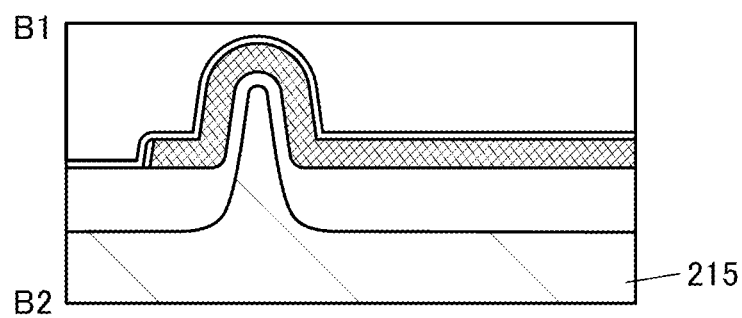
Figure 15C:
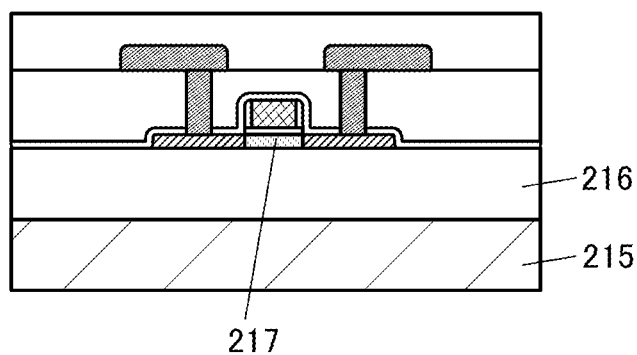

The transistors 102R, 103a, 104a, and 105a illustrated in the layer 210 in FIG. 14 are Si transistors. Although the transistors are planar transistors having channel formation regions in the silicon substrate 215 in FIG. 14, they may be FIN-type transistors as illustrated in FIG. 15A and FIG. 15B. FIG. 15A is a cross-sectional view in the channel length direction, and FIG. 15B is a cross-sectional view of a position of dashed-dotted line B1-B2 illustrated in FIG. 15A in the channel width direction.

Alternatively, as illustrated in FIG. 14, transistors each including a semiconductor layer 217 of a silicon thin film may be used. The semiconductor layer 217 can be single crystal silicon (SOI (Silicon on Insulator)) formed on an insulating layer 216 on the silicon substrate 215, for example.

The photoelectric conversion device 101R illustrated in the layer 210 has the structure of the pn-junction photodiode illustrated in FIG. 13A, and the layer 565a (n-type region) and the layer 565b (p-type region, part of the silicon substrate 215) are provided in the silicon substrate 215. The photoelectric conversion device 101R is a pinned photodiode, and includes a high-concentration p-type impurity layer at the interface with an insulating layer. This structure can suppress dark current. In addition, since the photoelectric conversion device 101R is directly connected to the transistor 102R, complete transfer of electric charge due to complete depletion is possible, and noise can be reduced.

In the layer 220, the transistors 10218, 103b, 104b, and 105b of the circuit 12IR are illustrated as examples of the components of the subpixel 10IR. OS transistors can be used as these transistors.

Figure 16A:
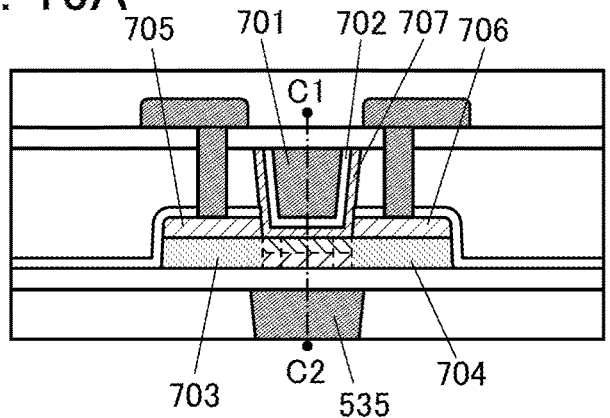
FIG. 16A to FIG. 16D are diagrams illustrating OS transistors.

The details of an OS transistor are illustrated in FIG. 16A. The OS transistor illustrated in FIG. 16A has a self-aligned structure in which a source electrode 705 and a drain electrode 706 are formed through formation of an insulating layer over a stack of an oxide semiconductor layer and a conductive layer and formation of an opening portion reaching the oxide semiconductor layer.

The OS transistor can include a gate electrode 701 and a gate insulating film 702 in addition to a channel formation region, a source region 703, and a drain region 704 that are formed in the oxide semiconductor layer. At least the gate insulating film 702 and the gate electrode 701 are provided in the opening portion. An oxide semiconductor layer 707 may also be provided in the opening portion.

Figure 16B:
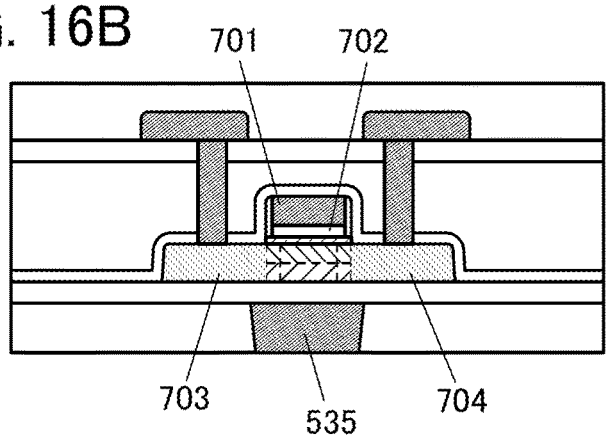

As illustrated in FIG. 16B, the OS transistor may have a self-aligned structure in which the source region 703 and the drain region 704 are formed in the semiconductor layer with the gate electrode 701 as a mask.

Figure 16C:
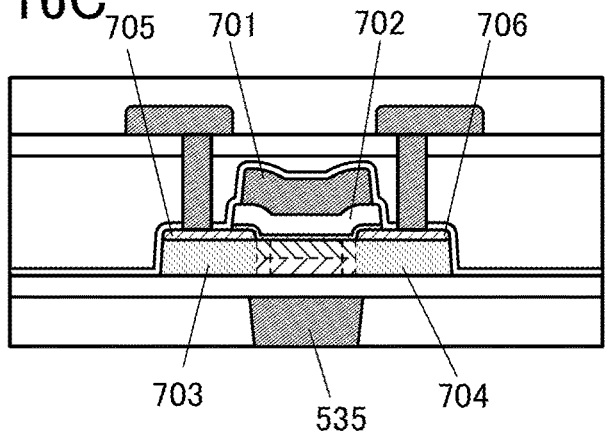

As illustrated in FIG. 16C, the OS transistor may be a non-self-aligned top-gate transistor including a region where the gate electrode 701 overlaps with the source electrode 705 or the drain electrode 706.

Figure 16D:
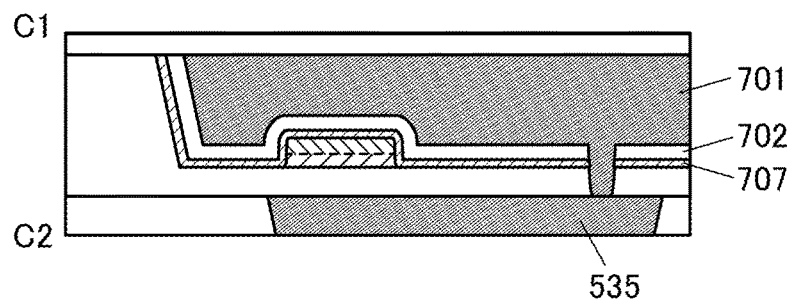

Although the OS transistor has a structure with a back gate 535, it may have a structure without a back gate. As illustrated in a cross-sectional view of the transistor in the channel width direction in FIG. 16D, the back gate 535 may be electrically connected to a front gate of the transistor, which is provided to face the back gate. Note that FIG. 16D illustrates a C1-C2 cross section of the transistor in FIG. 16A as an example, and the same applies to a transistor having any of the other structures. A structure may be employed in which different fixed potentials can be supplied to the back gate 535 and the front gate.

The layer 220 has a stacked structure and includes a multilayer wiring layer in which main wirings connected to the respective subpixels are stacked with an insulating layer therebetween. The wirings, or the wiring and the transistor are connected through a plug.

As the insulating layer, for example, an inorganic insulating film such as a silicon oxide film or an organic insulating film of an acrylic resin, a polyimide resin, or the like can be used. Furthermore, a silicon nitride film, a silicon oxide film, an aluminum oxide film, or the like may be stacked.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like is selected and used as appropriate. The conductor is not limited to a single layer, and may be a plurality of layers including different materials.

An insulating layer 225 is preferably provided between the layer in which the Si transistors are provided and the layer in which the OS transistors are provided. The insulating layer 225 functions as a blocking layer.

As the blocking layer, a film that has a function of preventing hydrogen diffusion is preferably used. In a Si device, hydrogen is necessary to terminate dangling bonds; however, hydrogen in the vicinity of an OS transistor is one of factors of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

In the layer 230, the light-blocking layer 232 and the color separation layers are provided. Here, as the color separation layers, the color filter 233R and the color filter 233G2 are shown. An opening portion 242 is provided in part of the light-blocking layer 232 and the color separation layer.

The light-blocking layer 232 can suppress entry of light into an adjacent pixel. As the light-blocking layer 232, a metal layer of aluminum, tungsten, or the like can be used. Alternatively, the metal layer and a dielectric film may be stacked. The dielectric film functions as an anti-reflection film.

Color filters can be used as the color separation layers for obtaining a visible-light image. Color filters of R (red), G (green), B (blue), and the like are assigned to the subpixels, whereby a color image can be obtained. Note that Y (yellow), C (cyan), and M (magenta) can also be used as the colors of the color filter.

The layer 240 includes the photoelectric conversion device 101IR and the insulating layer 241. FIG. 14 shows a structure in which the photoelectric conversion device 101IR uses the organic photoconductive film illustrated in FIG. 13B as the photoelectric conversion layer. Here, the layer 567a is the cathode and the layer 567e is the anode.

The layer 567a corresponding to the cathode of the photoelectric conversion device 101IR is electrically connected to the one of the source and the drain of the transistor 10218 included in the layer 220 through a plug 244 penetrating the insulating layer 241 provided in the opening portion 242. Note that the plug 244 corresponds to the plug 101IRP illustrated in FIG. 7B.

The layer 250 includes the microlens array 252. In the subpixel 10R, light passing through the microlens array 252 is emitted to the photoelectric conversion device 101R in the layer 210 through the photoelectric conversion device 101IR in the layer 240 and the color filter 233R in the layer 230.

With the microlens array 252, collected light can be incident on the photoelectric conversion device 101R; thus, photoelectric conversion can be efficiently performed. The microlens array 252 is preferably formed using a resin, glass, or the like with a high transmittance with respect to light having the infrared-light wavelength and the visible-light wavelength.

Figure 17:
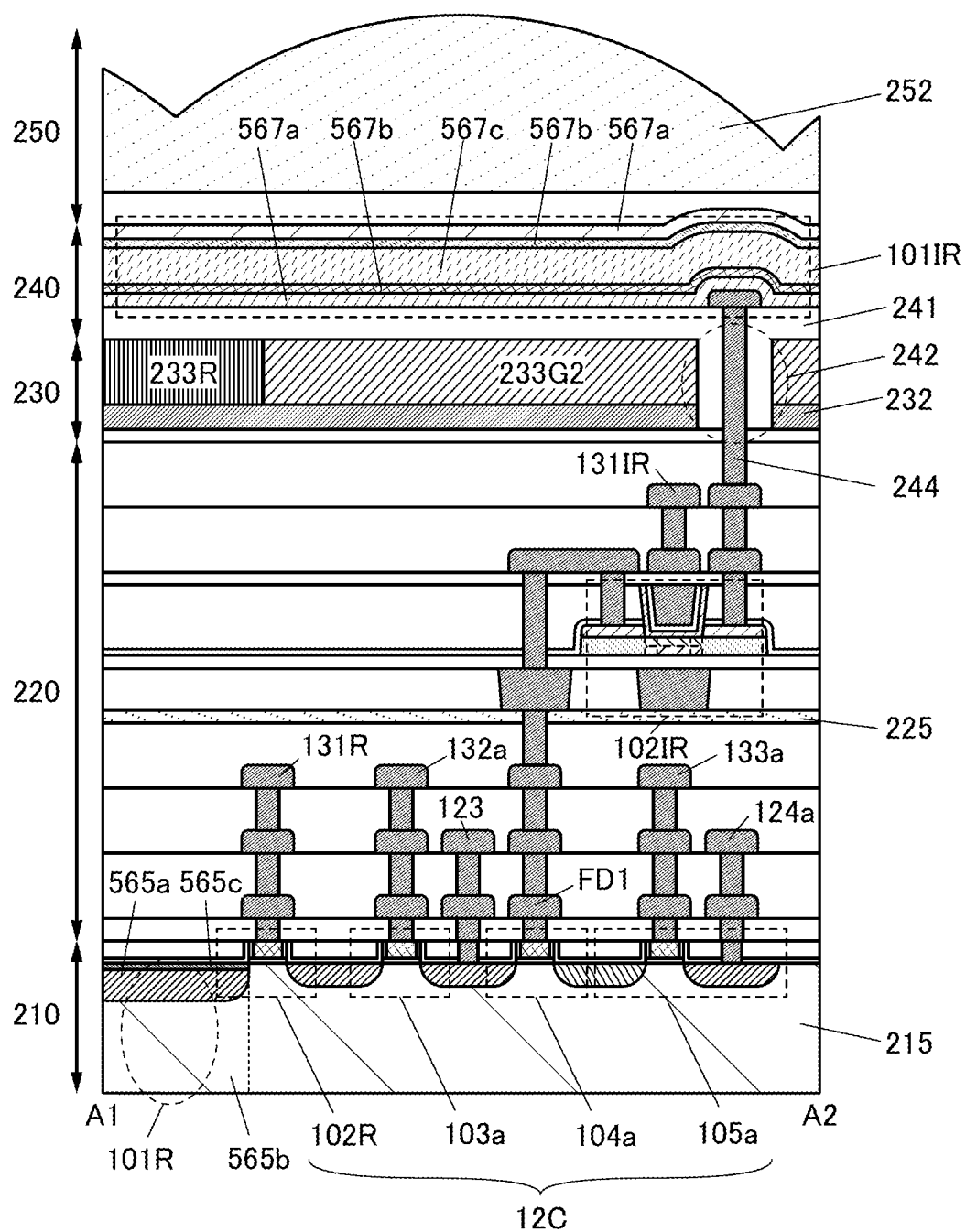
FIG. 17 is a cross-sectional view illustrating a pixel.

FIG. 14 illustrates the stacked structure of the case where the circuit structures illustrated in FIG. 4 and FIG. 5A are used. In the case where the circuit structure illustrated in FIG. 6 is used, a stacked structure illustrated in FIG. 17 can be employed.

Figure 18:
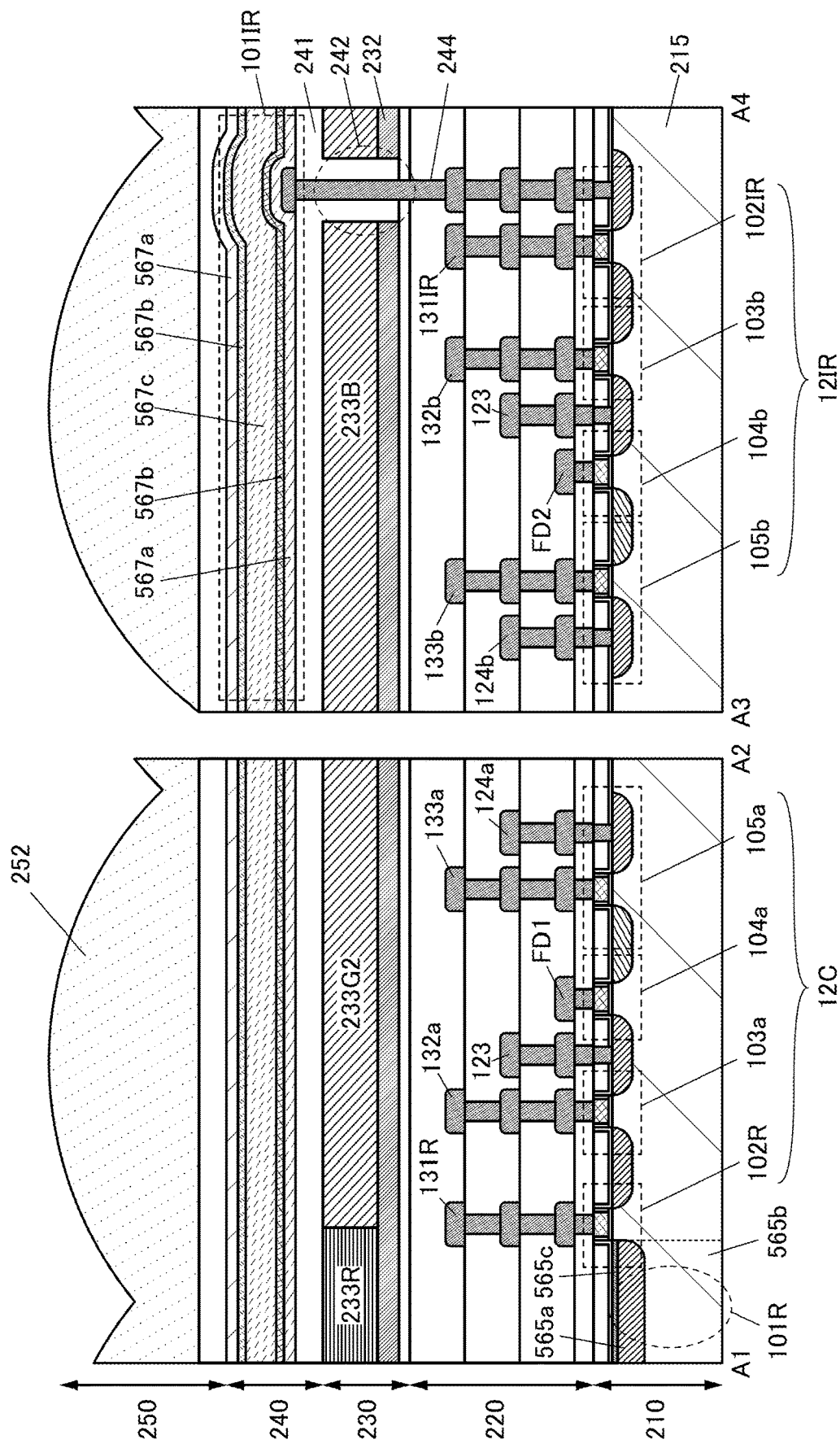
FIG. 18 is a cross-sectional view illustrating a pixel.

In the case where the circuit 121R is provided in the layer 210 as illustrated in the structure in FIG. 9 and FIG. 10, a stacked structure illustrated in FIG. 18 can be employed. The right portion of FIG. 18 is a cross-sectional view illustrating a plane in the height direction perpendicularly intersecting with dashed-dotted line A1-A2 in FIG. 9, and the left portion of FIG. 18 is a cross-sectional view illustrating a plane in the height direction perpendicularly intersecting with dashed-dotted line A3-A4 in FIG. 9.

In this structure, the circuit 12C and the circuit 121R included in the layer 210 can be manufactured through a common process. Moreover, the number of stacked layers in the layer 220 can be reduced, whereby the manufacturing process can be simplified.

<Package and Module>

FIG. 19A1 is an external perspective view of the top surface side of a package in which an image sensor chip is placed. The package includes a package substrate 410 to which an image sensor chip 450 (see FIG. 19A3) is fixed, a cover glass 420, an adhesive 430 for bonding them, and the like.

FIG. 19A2 is an external perspective view of the bottom surface side of the package. A BGA (Ball grid array) in which solder balls are used as bumps 440 on the bottom surface of the package is employed. Note that, without being limited to the BGA, an LGA (Land grid array), a PGA (Pin Grid Array), or the like may be employed.

FIG. 19A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 19B1 is an external perspective view of the top surface side of a camera module in which an image sensor chip is placed in a package with a built-in lens. The camera module includes a package substrate 411 to which an image sensor chip 451 (see FIG. 19B3) is fixed, a lens cover 421, a lens 435, and the like. An IC chip 490 (see FIG. 19B3) having functions of a driver circuit, a signal conversion circuit, and the like of an imaging device is provided between the package substrate 411 and the image sensor chip 451; thus, the structure as an SiP (System in package) is included.

FIG. 19B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 19B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed circuit board and the like; hence, the image sensor chip can be incorporated into a variety of semiconductor devices and electronic devices.

This embodiment can be combined with the description of the other embodiments as appropriate.

Embodiment 3

Examples of electronic devices that can include the imaging device of one embodiment of the present invention include display devices, personal computers, image memory devices and image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), and vending machines. FIG. 20A to FIG. 20F show specific examples of such electronic devices.

Figure 20A:
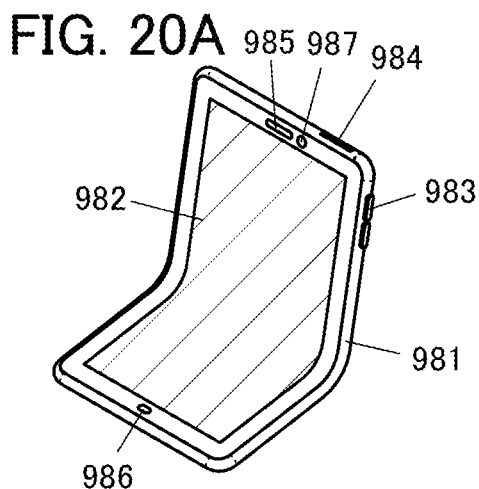
FIG. 20A to FIG. 20F are diagrams illustrating electronic devices.

FIG. 20A shows an example of a mobile phone that includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used in the mobile phone, enabling an infrared image as well as a color image to be obtained.

Figure 20B:
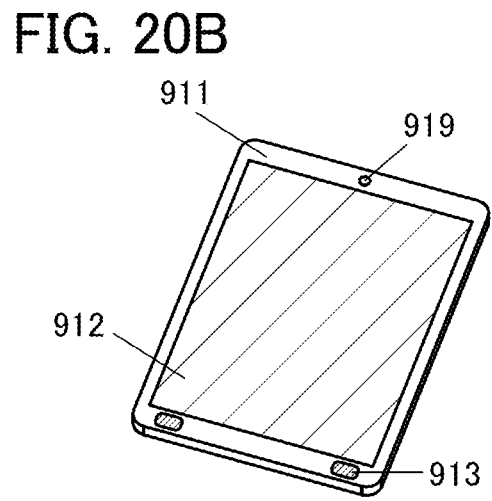

FIG. 20B shows a portable data terminal that includes a housing 911, a display portion 912, a speaker 913, a camera 919, and the like. A touch panel function of the display portion 912 enables input and output of information. Furthermore, text or the like can be recognized in an image captured by the camera 919, and the text can be output as voice from the speaker 913. The imaging device of one embodiment of the present invention and the operation method thereof can be used in the portable data terminal, enabling an infrared image as well as a color image to be obtained.

Figure 20C:
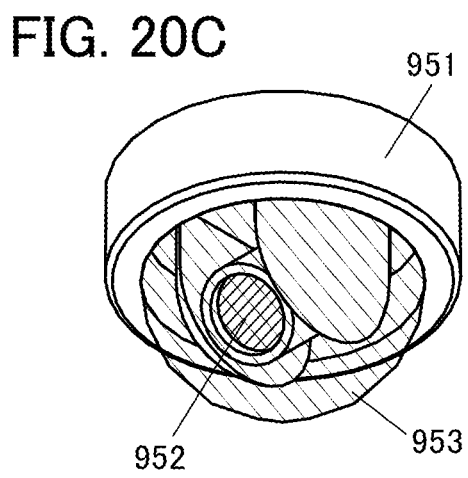

FIG. 20C shows a surveillance camera that includes a support base 951, a camera unit 952, a protection cover 953, and the like. The camera unit 952 is provided with a rotation mechanism and the like and can capture an image of all of the surroundings when provided on a ceiling. The imaging device of one embodiment of the present invention and the operation method thereof can be used to obtain an image in the camera unit, enabling an infrared image as well as a color image to be obtained. Note that a surveillance camera is a name in common use and does not limit the application thereof. A device that has a function of a surveillance camera can also be called a camera or a video camera, for example.

Figure 20D:
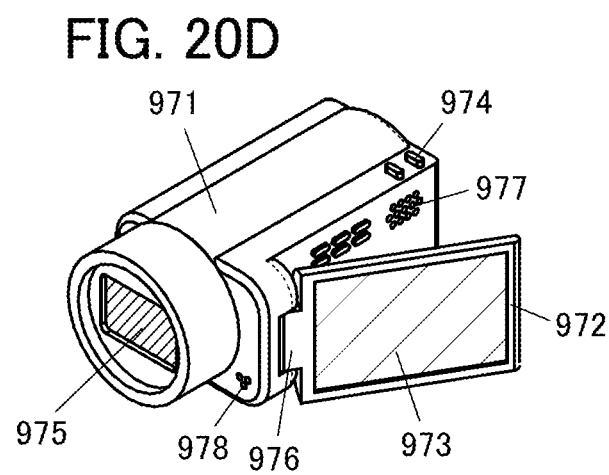

FIG. 20D shows a video camera that includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera, enabling an infrared image as well as a color image to be obtained.

Figure 20E:
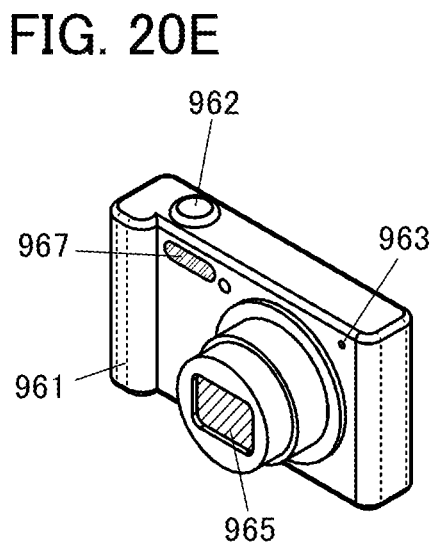

FIG. 20E shows a digital camera that includes a housing 961, a shutter button 962, a microphone 963, a light-emitting portion 967, a lens 965, and the like. The imaging device of one embodiment of the present invention and the operation method thereof can be used in the digital camera, enabling an infrared image as well as a color image to be obtained.

Figure 20F:
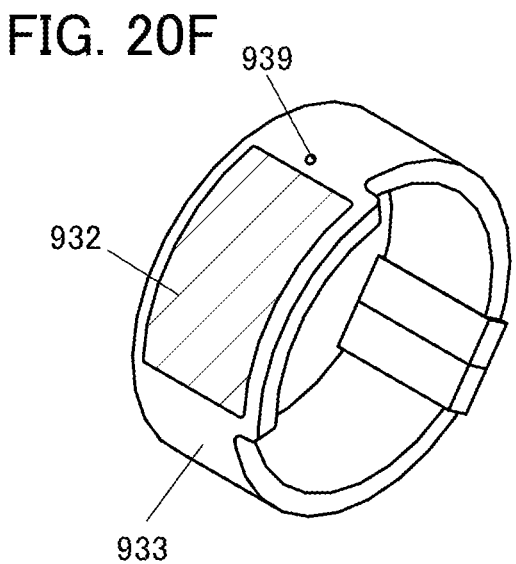

FIG. 20F shows a wrist-watch-type information terminal that includes a display portion 932, a housing and wristband 933, a camera 939, and the like. The display portion 932 is provided with a touch panel for operating the information terminal. The display portion 932 and the housing and wristband 933 have flexibility and fit a body well. The imaging device of one embodiment of the present invention and the operation method thereof can be used in the information terminal, enabling an infrared image as well as a color image to be obtained.

This embodiment can be combined with the description of the other embodiments as appropriate.

REFERENCE NUMERALS

10: pixel, 10B: subpixel, 10G1: subpixel, 10G2: subpixel, 10IR: subpixel, 10R: subpixel, 12C: circuit, 12CIR: circuit, 12IR: circuit, 12S: circuit, 21: pixel array, 22: circuit, 23: circuit, 24: circuit, 25: circuit, 26: circuit, 28: circuit, 101B: photoelectric conversion device, 101C: photoelectric conversion device, 101G1: photoelectric conversion device, 101G2: photoelectric conversion device, 101IR: photoelectric conversion device, 101IRP: plug, 101R: photoelectric conversion device, 102B: transistor, 102G1: transistor, 102G2: transistor, 10218: transistor, 102R: transistor, 103*a*: transistor, 103*b*: transistor, 104*a*: transistor, 104*b*: transistor, 105*a*: transistor, 105*b*: transistor, 108*a*: capacitor, 108*b*: capacitor, 121: wiring, 122: wiring, 123: wiring, 123P: plug, 123P2: plug, 124*a*: wiring, 124*a*P: plug, 124*b*: wiring, 124*b*P: plug, 131B: wiring, 131BP: plug, 131G1: wiring, 131G1P: plug, 131G2: wiring, 131G2P: plug, 131IR: wiring, 131IRP: plug, 131R: wiring, 131RP: plug, 132*a*: wiring, 132*a*P: plug, 132*b*: wiring, 132*b*P: plug, 133*a*: wiring, 133*a*P: plug, 133*b*: wiring, 133*b*P: plug, 150: wiring, 150C: wiring, 150IR: wiring, 210: layer, 215: silicon substrate, 216: insulating layer, 217: semiconductor layer, 220: layer, 221: insulating layer, 225: insulating layer, 230: layer, 231: insulating layer, 232: light-blocking layer, 233B: color filter, 233G1: color filter, 233G2: color filter, 233R: color filter, 240: layer, 241: insulating layer, 244: plug, 250: layer, 251: insulating layer, 252: microlens array, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 535: back gate, 565*a*: layer, 565*b*: layer, 567*a*: layer, 567*b*: layer, 567*c*: layer, 567*d*: layer, 567*e*: layer, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera.

This application is based on Japanese Patent Application Serial No. 2019-210989 filed on Nov. 22, 2019 and Japanese Patent Application Serial No. 2019-230309 filed on Dec. 20, 2019, the entire contents of each which are hereby incorporated herein by reference.

The invention claimed is:

1. An imaging device comprising:
a first layer;
a second layer; and
a third layer,
wherein the third layer is provided between the first layer and the second layer,
wherein the first layer comprises a first transistor, a second transistor, a third transistor, a fourth transistor, a first photoelectric conversion device, a second photoelectric conversion device, a third photoelectric conversion device, and a fourth photoelectric conversion device,
wherein the second layer comprises a fifth photoelectric conversion device,
wherein the third layer comprises a fifth transistor,
wherein the first transistor to the fourth transistor each comprise silicon in a channel formation region,
wherein the fifth transistor comprises a metal oxide in a channel formation region,
wherein the first photoelectric conversion device to the fourth photoelectric conversion device each comprise silicon in a photoelectric conversion layer,
wherein the fifth photoelectric conversion device comprises an organic photoconductive film in a photoelectric conversion layer,
wherein the first transistor is electrically connected to the first photoelectric conversion device,
wherein the second transistor is electrically connected to the second photoelectric conversion device,
wherein the third transistor is electrically connected to the third photoelectric conversion device,
wherein the fourth transistor is electrically connected to the fourth photoelectric conversion device,
wherein the fifth transistor is electrically connected to the fifth photoelectric conversion device, and
wherein the fifth photoelectric conversion device comprises a region overlapping with each of the first photoelectric conversion device to the fourth photoelectric conversion device.

2. The imaging device according to claim 1, further comprising a fourth layer,
wherein the fourth layer is provided between the third layer and the second layer, and
wherein the fourth layer comprises a color filter.

3. The imaging device according to claim 1,
wherein the metal oxide comprises In, Zn, and M,
wherein M is one or more of Al, Ti, Ga, Ge, Sn, Y, Zr, La, Ce, Nd, and Hf).

4. The imaging device according to claim 1,
wherein the fifth photoelectric conversion device comprises a photoelectric conversion layer that generates electric charge by absorbing infrared light.

5. The imaging device according to claim 1,
wherein the organic photoconductive film has a visible-light transmitting property.

6. The imaging device according to claim 1, further comprising a fourth layer, wherein the fourth layer is provided between the third layer and the second layer, and
wherein the fourth layer comprises a color filter.

7. An electronic device comprising:
the imaging device according to claim 2; and
a display device.

* * * * *